(12) United States Patent
Wendt et al.

(10) Patent No.: US 8,059,945 B2
(45) Date of Patent: *Nov. 15, 2011

(54) NOZZLE-BASED, VAPOR-PHASE, PLUME DELIVERY STRUCTURE FOR USE IN PRODUCTION OF THIN-FILM DEPOSITION LAYER

(75) Inventors: Robert G. Wendt, Tucson, AZ (US);
Scott Wiedeman, Tucson, AZ (US);
Jeffrey S. Britt, Tucson, AZ (US);
Douglas G. Mason, Tucson, AZ (US)

(73) Assignee: Global Solar Energy, Inc., Tucson, AZ (US)

( * ) Notice: Subject to any disclaimer, the term of this patent is extended or adjusted under 35 U.S.C. 154(b) by 48 days.

This patent is subject to a terminal disclaimer.

(21) Appl. No.: 12/154,549

(22) Filed: May 22, 2008

(65) Prior Publication Data

US 2008/0247737 A1    Oct. 9, 2008

Related U.S. Application Data

(63) Continuation of application No. 11/725,975, filed on Mar. 19, 2007, now Pat. No. 7,760,992, which is a continuation of application No. 09/613,951, filed on Jul. 11, 2000, now Pat. No. 7,194,197, which is a continuation of application No. 09/527,542, filed on Mar. 16, 2000, now Pat. No. 6,310,281, and a continuation of application No. 09/527,316, filed on Mar. 16, 2000, now Pat. No. 6,372,538.

(51) Int. Cl.
*B01D 7/00* (2006.01)

(52) U.S. Cl. .......................... 392/389; 392/388

(58) Field of Classification Search .................. 392/388, 392/389
See application file for complete search history.

(56) References Cited

U.S. PATENT DOCUMENTS

| | | | |
|---|---|---|---|
| 3,328,017 A | 6/1967 | Conner |
| 3,345,059 A | 10/1967 | Swindt |
| 3,884,688 A | 5/1975 | Schottmiller et al. |
| 4,318,938 A | 3/1982 | Barnett et al. |
| 4,325,986 A | 4/1982 | Baron et al. |
| 4,392,451 A | 7/1983 | Mickelson et al. |
| 4,401,052 A | 8/1983 | Baron et al. |
| RE31,968 E | 8/1985 | Mickelsen et al. |
| 4,812,326 A | 3/1989 | Tsukazaki et al. |
| 4,844,719 A | 7/1989 | Toyomoto et al. |
| 5,031,229 A | 7/1991 | Chow |
| 5,053,355 A | 10/1991 | Von Campe |
| 5,149,375 A | 9/1992 | Matsuyama |
| 5,158,750 A | 10/1992 | Finicle |
| 5,216,742 A | 6/1993 | Krug et al. |
| 5,239,611 A | 8/1993 | Weinert |
| 5,445,973 A | 8/1995 | Hedstrom |
| 5,571,749 A | 11/1996 | Matsuda et al. |
| 5,741,547 A | 4/1998 | Akram et al. |
| 5,803,976 A | 9/1998 | Baxter et al. |

(Continued)

OTHER PUBLICATIONS

Non-Final Office action dated Jul. 21, 2010 for U.S. Appl. No. 12/154,550.

(Continued)

*Primary Examiner* — Thor Campbell
(74) *Attorney, Agent, or Firm* — Kolisch Hartwell, P.C.

(57) ABSTRACT

A vapor deposition source including a crucible configured to hold a quantity of molten constituent material and at least one nozzle to pass vapor evaporated from the molten constituent material out of the crucible.

11 Claims, 14 Drawing Sheets

U.S. PATENT DOCUMENTS

| | | | |
|---|---|---|---|
| 5,820,681 | A | 10/1998 | Colombo et al. |
| 6,074,487 | A | 6/2000 | Yoshioka et al. |
| 6,092,669 | A | 7/2000 | Kushiya et al. |
| 6,310,281 | B1 | 10/2001 | Wendt et al. |
| 6,372,538 | B1 | 4/2002 | Wendt et al. |
| 7,194,197 | B1 | 3/2007 | Wendt et al. |

OTHER PUBLICATIONS

U.S. Appl. No. 11/725,975, filed Mar. 19, 2007, Wendt et al.
U.S. Appl. No. 12/154,548, filed May 22, 2008, Wendt et al.
U.S. Appl. No. 12/154,549, filed May 22, 2008, Wendt et al.
U.S. Appl. No. 12/154,550, filed May 22, 2008, Wendt et al.
U.S. Appl. No. 09/613,950, filed Jul. 11, 2000, Wendt et al.
U.S. Appl. No. 09/614,532, filed Jul. 11, 2000, Wendt et al.
U.S. Appl. No. 09/614,539, filed Jul. 11, 2000, Wendt et al.
T.W.F. Russell, *Technology Development Versus New Ideas Development by Universities*, The American Institute of Physics, pp. 93-99 (1997).
S.C. Jackson et al., *A Chemical Reaction Model for Physical Vapor Deposition of Compound Semiconductor Films*, AIChE Journal, vol. 33, No. 5, pp. 711-721 (May 1987).
S.C. Jackson et al., *Molecular Beam Distributions from High Rate Sources*, J. Vac. Sci. Technol., American Vacuum Society, pp. 1916-1920 (Oct. 1985).
T.W.F. Russell et al., *Properties of Continuously-Deposited Photovotaic-Grade CdS*, $16^{th}$ IEEE Photovoltaic Specialists Conference, San Diego, CA, pp. 1-8 (Sep. 28-Oct. 1, 1982).
R. E. Rocheleau et al., *Continuous Deposition of Photovoltaic-Grade CdS Sheet at the Unit Operations Scale*, $4^{th}$ European Communities PVSEC, Stresa, Italy (May 10-14, 1982), pp. 1-7.
R. E. Rocheleau et al., *Analysis of Evaporation of Cadmium Sulfide for Manufacture of Solar Cells*, AIChE Journal, vol. 28, No. 4 (Jul. 1982).
J. A. Giordmaine et al., *Molecular Beam Formation by Long Parallel Tubes*, Journal of Applied Physics, vol. 31, No. 3 (Mar. 1960).
Gordon P. Brown et al., *The Flow of Gases in Pipes at Low Pressures*, Journal of Applied Physics, vol. 17, pp. 802-813 (Oct. 1946).
R.M. Birkmire, Recent Progress and Critical Issues in Thin Film Polycrystalline Solar Cells and Modules, Internet, 99. 1-6, (1997).
Non-final Office Action dated Jan. 4, 2001 for U.S. Pat. No. 6,310,281.
Non-final Office Action dated Mar. 23, 2001 for U.S. Pat. No. 6,372,538.
Non-final Office Action dated Feb. 4, 2002 for U.S. Appl. No. 09/613,950.
Final Office Action dated Nov. 4, 2002 for U.S. Appl. No. 09/613,950.
Non-final Office Action dated Dec. 19, 2001 for U.S. Appl. No. 09/614,532.
Final Office Action dated Aug. 13, 2002for U.S. Appl. No. 09/614,532.
Non-final Office Action dated Aug. 6, 2002 for U.S. Appl. No. 09/614,539.
Final Office Action dated Apr. 8, 2003 for U.S. Appl. No. 09/614,539.
Non-final Offical Action dated Jan. 28, 2002 for U.S. Pat. No. 7,194,197.
Final Office Action dated Nov. 8, 2002 for U.S. Pat. No. 7,194,197.
Non-final Office Action dated Dec. 12, 2003 for U.S. Pat. No. 7,194,197.
Non-final Office Action dated Sep. 21, 2004 for U.S. Pat. No. 7,194,197.
Final Office Action dated Aug. 26, 2005 for U.S. Pat. No. 7,194,197.
Non-final Office Action dated Feb. 7, 2007 for U.S. Pat. No. 7,194,197.

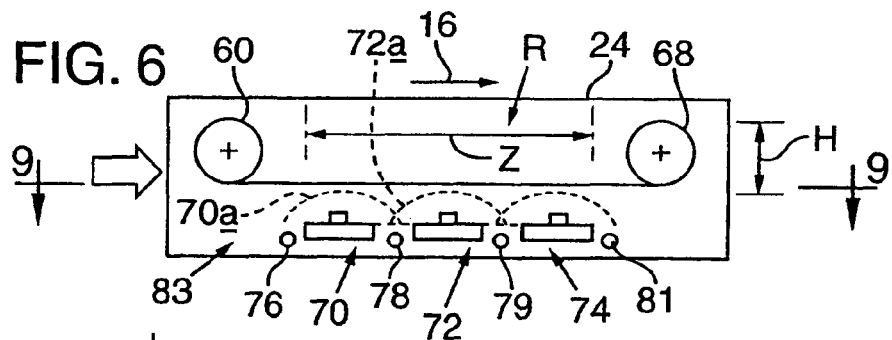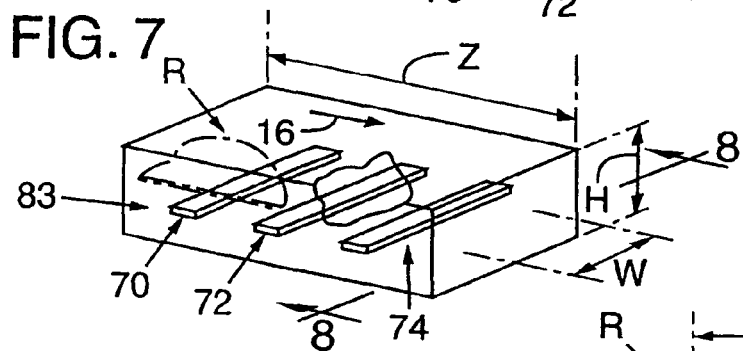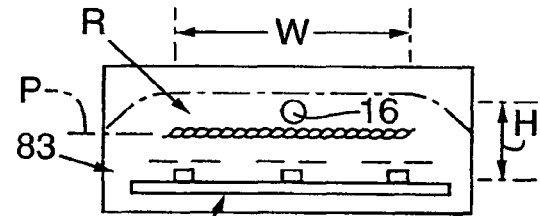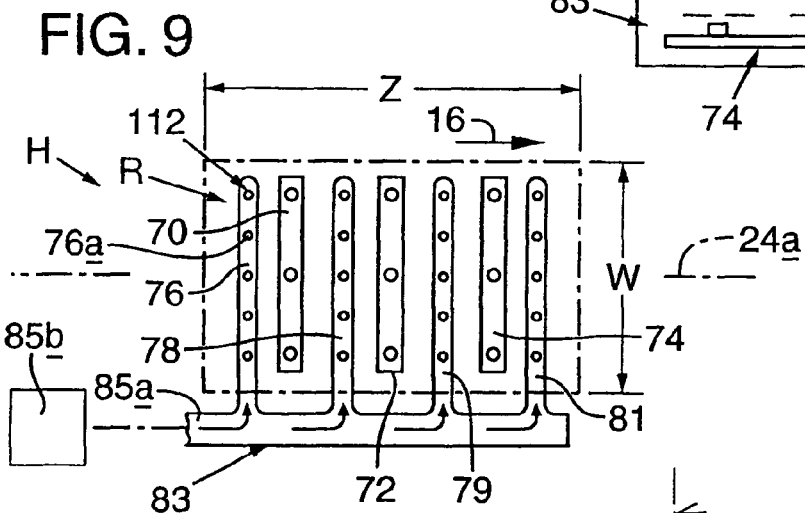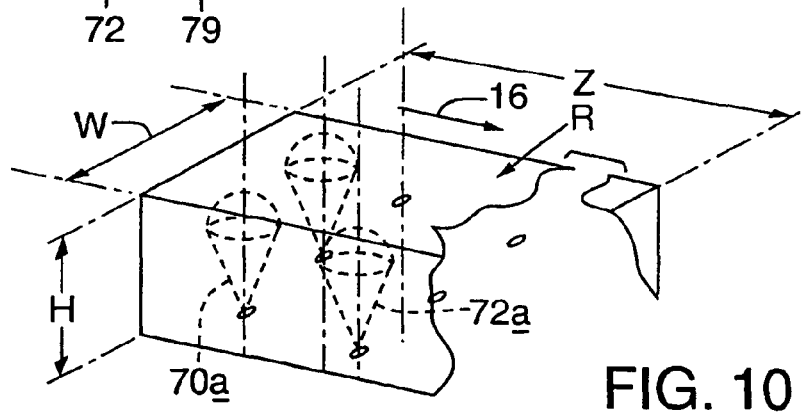

NOZZLE-BASED, VAPOR-PHASE, PLUME DELIVERY STRUCTURE FOR USE IN PRODUCTION OF THIN-FILM DEPOSITION LAYER

CROSS-REFERENCE TO RELATED APPLICATION

This is a continuation patent application of U.S. patent application Ser. No. 11/725,975 filed Mar. 19, 2007 now U.S. Pat. No. 7,760,992 which is a continuation of application Ser. No. 09/613,951 filed on Jul. 11, 2000, now U.S. Pat. No. 7,194,197 which is a continuation of application Ser. No. 09/527,542, filed on Mar. 16, 2000, now U.S. Pat. No. 6,310,281, and a continuation of application Ser. No. 09/527,316, filed Mar. 16, 2000, now U.S. Pat. No. 6,372,538, each of which is hereby incorporated by reference. Application Ser. No. 09/613,950 filed Jul. 11, 2000, now abandoned, application Ser. No. 09/614,532 filed Jul. 11, 2000, now abandoned, and application Ser. No. 09/614,539 filed Jul. 11, 2000, now abandoned, were also continuation applications of application Ser. No. 09/527,542, filed on Mar. 16, 2000, now U.S. Pat. No. 6,310,281, and application Ser. No. 09/527,316, filed Mar. 16, 2000, now U.S. Pat. No. 6,372,538.

This invention was made with Government support under Agreement No. MDA972-95-3-0036 awarded by DARPA. The Government has certain rights in the invention.

TECHNICAL FIELD, BACKGROUND ART AND TECHNICAL ISSUES, SUMMARY OF THE INVENTION

1. Field of the Invention

The invention disclosed herein relates to the field of thin-film deposition, in general to controlled evaporation of single component elements to create complex multi-element films.

2. Background of the Invention

Looking briefly at the background of the invention, thin-film deposition is typically accomplished by two basic methods: (1) physical vapor deposition (PVD) or (2) chemical vapor deposition (CVD). Although there are several subsets of the above techniques, generically all thin films (micron to submicron) are deposited by one of the two methods. This invention particularly relates to PVD processes and more particularly to the PVD field of evaporation. In PVD based processes, atoms are removed from a source material by some physical technique that adds energy to the system causing atoms to be removed. Examples of PVD techniques include sputtering, resistive evaporation, and electron-beam evaporation. In sputtering, the atoms of the source material are removed by the physical act of colliding argon atoms with the source material. The evaporation technique entails removing atoms from the source material by adding heat until the source material atoms are more stable in a gaseous state than in the liquid or solid state. Sputtering and evaporation are well known PVD processes for which several excellent references are available. (Vossen, Maissel and Glanc).

Generally, sputtering can be characterized as a well-controlled, well-engineered process. Sputtering cathodes, power supplies, and source material targets are available from several vendors. Sputtering has been successfully applied in several thin-film applications including deposition of impermeable films on food packaging, low emissivity (low-e) coatings on residential and commercial plate glass, and decorative coatings. Control of sputtered film uniformity has been engineered into the cathode structure. Negative aspects of sputtering including the high cost of the sputtering systems, that the source (target) utilization is generally poor (20 to 40%), and that there are temporal limitations in creating multi-component films (i.e., more that three elements). More specifically, to sputter multi-component films, individual layers are usually deposited followed by a heat treatment cycle to react the components together, which may require considerable time.

Although generally more difficult to control than sputtering, evaporation, is also used in commercial industrial applications. Evaporation is typically used when the specific film thickness uniformity and composition are not critical. Key advantages of evaporation are the low cost of pellets or wire source materials, the low cost of power supplies and crucibles (as compared to sputtering), and the potential for high source utilization (>50%). However, to achieve a uniform film thickness using evaporation requires multiple evaporation sources. As a result, evaporation is less prevalent for films requiring precise thickness or composition uniformity. However, application of evaporation to complex multi-component films that contain one or more highly reactive species has proved problematic due to the relative consistent rate control and thickness uniformity issues.

As noted above, complex multi-element films are difficult to produce using currently available techniques of sputtering or evaporation. The invention described herein provides a new class of evaporation principles and associated evaporation sources resulting in the creation of uniform, well controlled multi-element thin films.

The explicative example uncovered in this invention is deposition of complex 4 or 5 element direct bandgap semiconductors used for photovoltaics.

Looking briefly at the background for the field of photovoltaics generally relates to the development of multi-layer materials that convert sunlight directly into DC electrical power. In the United States, photovoltaic (PV) devices are popularly known as solar cells—which are typically configured as a cooperating sandwich of p- and n-type semiconductors, wherein the n-type semiconductor material (on one "side" of the sandwich) exhibits an excess of electrons, and the p-type semiconductor material (on the other "side" of the sandwich) exhibits an excess of holes. Such a structure, when appropriately located electrical contacts are included, forms a working PV cell. Sunlight incident on PV cells is absorbed in the p-type semiconductor creating electron/hole pairs. By way of a natural internal electric field created by sandwiching p- and n-type semiconductors, electrons created in the p-type material flow to the n-type material where they are collected, resulting in a DC current flow between the opposite sides of the structure when the same is employed within an appropriate, closed electrical circuit. As a standalone device, conventional solar cells do not have a sufficient voltage required to power most applications. As a result, conventional solar cells are arranged into PV modules by connecting the front of one cell to the back of another, thereby adding the voltages of the individual cells together. Typically a large number of cells, on the order to 36 to 50 are required to be connected in series to achieve a nominal usable voltage of 12 to 18 V.

Although commercial use and interest in thin-film photovoltaics has increased dramatically over the past five years, commercial wide-scale use of thin film PVs for bulk power generation historically has been limited due to PV's low performance and high cost. In recent years, however, performance has been less of a limiting factor as dramatic improvements in PV module efficiency have been achieved with both crystalline silicon and thin-film photovoltaics. The laboratory scale efficiency of crystalline silicon is approaching 20%.

Modules ranging from 10 to 14% are currently commercially available from several vendors. Similarly, laboratory scale efficiencies of above 10% have been achieved with thin-film PV devices of copper indium diselenide, cadmium telluride, and amorphous silicon. The efficiency of a thin film copper-indium-gallium-diselenide (CIGS) PV device is now approaching 19%. Additionally, several companies have achieved thin-film large area module efficiencies ranging from 8 to 12%. These recent improvements in efficiency have greatly reduced performance concerns leaving cost as the primary deterrent preventing wide-scale commercial application of PV modules for electricity generation.

Thin-film photovoltaics, namely amorphous silicon, cadmium telluride, and copper-indium-diselenide (CIS), offer reduced cost by employing deposition techniques widely used in the thin-film industry for protective, decorative, and functional coatings. Common examples of low cost commercial thin-film products include water permeable coatings on polymer-based food packaging, decorative coatings on architectural glass, low emissivity thermal control coatings on residential and commercial glass, and scratch and anti-reflective coatings on eyewear.

Of all thin film PV compositions, CIGS has demonstrated the greatest potential for high performance and low cost. More specifically, CIGS has achieved the highest laboratory efficiency (18.8% by NREL), is stable, has low toxicity, and is truly thin-film (requiring less than two microns layer thickness). These characteristics allow for the large-scale low cost manufacturing of CIGS PVs thereby enabling the penetration by thin-film PVs into bulk power generation markets.

SUMMARY OF THE INVENTION

The overall efforts that surround the developments that are specifically addressed in this document have introduced a significant collection of innovations that apply to improved low-cost, large-scale manufacturing to the field of photovoltaics and thin films. Generally speaking, several key areas of these innovations include: (1) a general fabrication procedure, including a preferably roll-to-roll-type, process-chamber-segregated, "continuous-motion", method for producing such a structure; (2) a special multi-material vapor-deposition environment which is created to implement an important co-evaporation, layer-deposition procedure performed in and part of the method just mentioned; (3) a structural system uniquely focused on creating a vapor environment generally like that just referred to; (4) an organization of method steps involved in the generation of such a vapor environment; (5) a unique, vapor-creating, materials-distributing system, which includes specially designed heated crucibles with carefully arranged, spatially distributed, localized and generally point-like, heated-nozzle sources of different metallic vapors, and a special multi-fingered, comb-like, vapor-delivering manifold structure.

BRIEF DESCRIPTION OF THE FIGURES

FIG. 6 is a simplified, schematic side elevation illustrating a chamber wherein one format of copper-undium-gallium-diselenide (CIGS) or copper-indium-diselenide (CIS) roll-to-roll strip processing occurs according to the disclosed embodiment, with this one format involving movement of strip material past three vapor-plume-creating stations.

FIG. 7 is a schematic, perspective and partially-fragmented view of a deposition zone R which exists in the chamber pictured in FIG. 6.

FIG. 8 is a schematic section view taken generally along the line 8-8 in FIG. 7.

FIG. 9 is a fragmentary plan view generally along the line 9-9 in FIG. 6.

FIG. 10 is a fragmentary schematic perspective view of a vapor-deposition zone R wherein certain vapor-creating and vapor-presence phenomena exist and take place within the chamber illustrated in FIGS. 6, 7 and 8.

DETAILED DESCRIPTION

Figure 1:
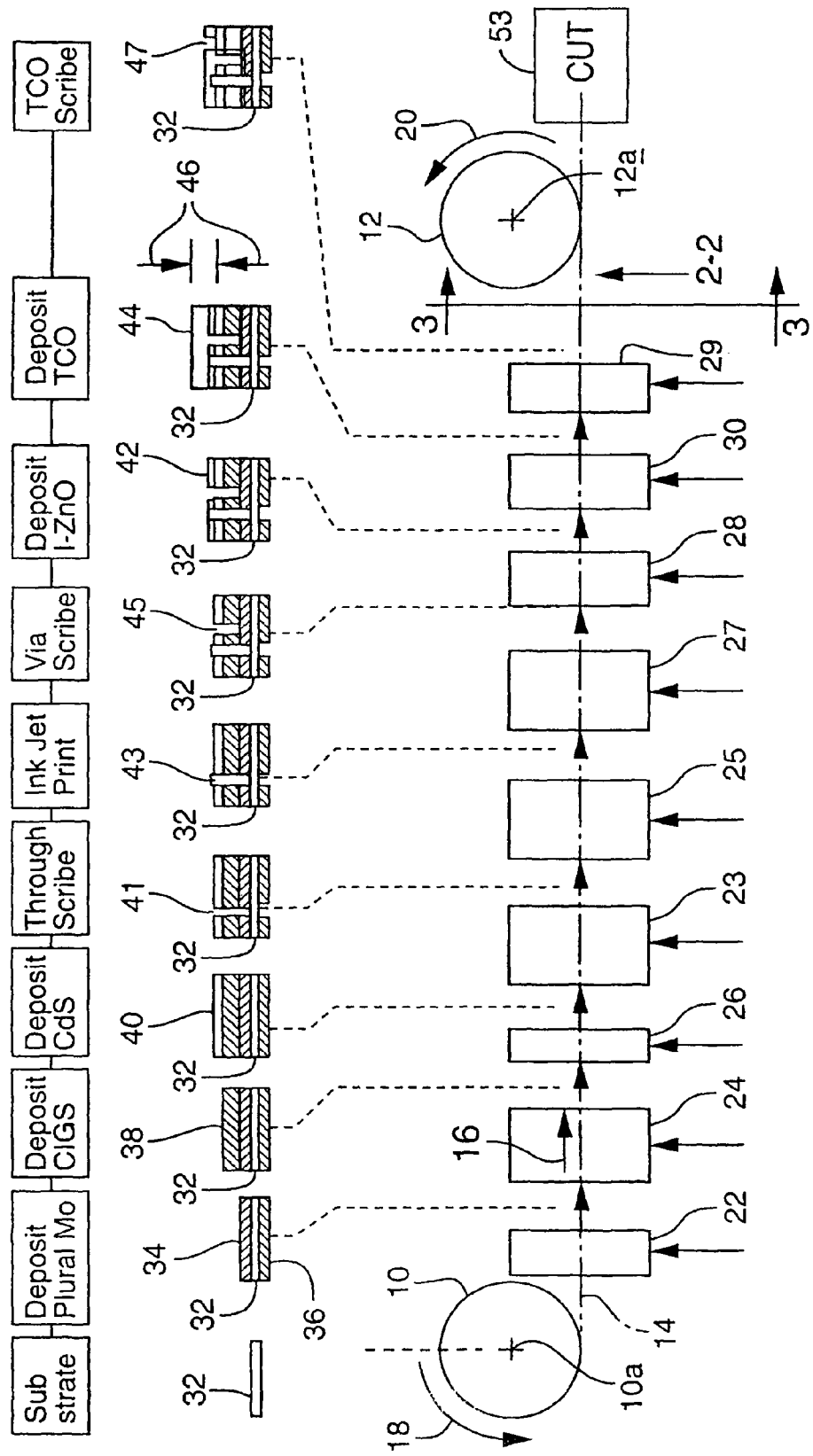
FIG. 1 is a simplified schematic elevation generally illustrating process steps and stages employed for creating a photovoltaic (PV) module.

FIG. 1 illustrates the steps involved preferably in making a new kind of photovoltaic (PV) module in a roll-to-roll, continuous-motion process in accordance with the present invention. Those skilled in the art should understand that, while roll-to-roll, continuous motion processing is employed in the described embodiment, non-roll-to-roll procedures could be used effectively in certain applications.

FIG. 1 shows two rolls 10, 12, at the left and right, respectively, which symbolize the several roll-to-roll, continuous-motion processing stages employed in the manufacturing of this new kind of PV module. Roll 10 represents a pay-out roll, and roll 12, a take-up roll. It should be understood that rolls 10, 12 are representative of the different pay-out and take-up rolls that are employed in different isolated processing chambers. Thus, there are typically multiple pay-out and take-up rolls used during the overall process.

A stretched-out, flat portion of an elongate strip of thin, flexible, substrate material 14 is shown extending between rolls 10, 12. This substrate strip has different amounts of applied (deposited) PV-cell layer structure at different positions between the rolls. The strip has opposite end winds that are distributed as turns on pay-out roll 10 and take-up roll 12.

The direction of travel of the strip material during processing is indicated generally by arrow 16. Curved arrows 18, 20 indicate, symbolically, the related, associated directions of rotation of rolls 10, 12 about axes 10a, 12a, respectively, which are generally normal to the plane of FIG. 1.

Reference herein to the substrate strip material 14 should be understood to be reference to a strip of material whose overall structural character changes as the material travels, in accordance with processing steps, between rolls 10 and 12. Through the processing steps, layers of various components that go into the fabrication of the type of PV-module are added.

Nine separate individual processing chambers 22, 24, 26 23, 25, 27, 28, 30, 29 are illustrated as rectangular blocks in FIG. 1. The various layers of materials that are used to form a PV module according to this invention are applied or modified in these chambers. The relative sizes of these blocks as pictured in FIG. 1 are not important. It should be noted that the steps represented by some of the processing chambers are optional in some applications. For instance, the intrinsic-zinc-oxide (i-ZnO) layer created in chamber 28 may be omitted.

Processing begins with a bare starter roll, or strip, of elongate thin-film, flexible substrate material, preferably polyimide (PI), which is supplied from pay-out roll 10. This uncoated material might typically have a width of about 33-cm, a thickness of about 0.005-cm, and a length of up to about 300-meters. The width, thickness and length dimensions are, of course, matters of choice, depending on the ultimate intended application for finished PV modules. One PI material suitable for use in the disclosed system, is Upilex S—a material currently available commercially from KISCO in Santa Clara, Calif.

PI is a suitable supporting substrate because it (1) can be made very thin, and thus can offer good flexibility, and (2) can tolerate relatively high-temperature environments without sustaining damage. PI material also is quite widely commercially available, and is relatively inexpensive. Of course other materials having similar physical properties, such as any high-temperature polymer, or a thin metal such as stainless steel, titanium, covar, invar, tantalum, brass or niobium etc, can also be used with appropriate process modifications.

A fragment of such a starter strip of PI is illustrated generally on edge at 32, immediately above roll 10. PI fragment 32 advances to the right in FIG. 1 through the several processing environments represented in this figure, and is referred to throughout the discussion of this figure with the same reference numeral 32.

A stress-compliant metal interlayer, preferably nickel-vanadium (Ni—V), chosen to have intermediate thermal expansion characteristics between the PI and a subsequently-applied molybdenum (Mo) layers can be optionally utilized as the first layer deposited onto the PI. This step is not illustrated in FIG. 1, but can either be accomplished in a chamber similar in construction to chamber 22 or within a separate processing zone in chamber 22.

Within chamber 22, and in a manner that will be more fully discussed shortly, two layers of Mo, each containing entrained oxygen, and each possessing a certain level of intentionally created, desired, internal compressive stress, are formed on the opposite sides, or faces, of PI strip 32. These two layers are shown on the opposite faces (top and bottom in FIG. 1) of fragment 32 at 34, 36 above chamber 22. Layer 34 forms a back contact layer for the PV module of the present invention. In the case of a stainless steel substrate strip, the Mo back contact layer would normally be replaced with a chromium/molybdenum (Cr/Mo) bilayer.

Material emerging from Mo-processing in chamber 22 is ready for introduction into chamber 24, wherein it is exposed to a unique vapor deposition environment created in accordance with the current invention to create an absorber layer.

In chamber 24, a multi-element crystalline absorber layer 38 is formed on Mo layer 34 by a unique multi-source co-evaporation technique. Preferably, layer 38 is p-type semiconductor in the form of copper-indium-gallium-diselenide (CIGS), or its readily acceptable counterpart, copper-indium-diselenide (CIS). For purposes of simplicity, the following discussion will generally utilize CIS or CIGS to refer to CIS with or without metal alloys such as gallium, aluminum, boron, or sulfur. These different compositions, among others, can be used essentially interchangeably as an absorber layer in various embodiments of the invention depending on the particular properties desired in the final product.

As a direct consequence of the particular co-deposition events that take place in the unique fog environment that exists in chamber 24, layer 38 has a consistent multi-element-compositional make-up and uniform thickness throughout. This applies both longitudinally over the length of the substrate and side-to-side across the substrate. Next, adhesion of the CIGS layer to the receiving surface of the pre Mo layer is excellent. The adhesion occurs with (a) no appreciable fabrication-caused damage to the Mo layer, and (b) formation of a proper-constituent content, single-crystalline structure in the CIGS layer. Lastly, these benefits are achieved using a relatively simple, single-deposition-chamber operation.

The configuration of the stack of layers after emergence of the substrate from chamber 24 is shown above chamber 24. Note that in this fragmentary edge view, only the most recently added layer (38) is designated with a layer reference numeral, along with PI designator 32. This labeling approach is used throughout the remainder of the description provided herein for FIG. 1.

In chamber 26, a window or buffer layer in the form of cadmium-sulfide (CdS) is applied as a layer 40 extending over the CIGS or CIS layer that was formed in chamber 24. The CdS layer is preferably applied in a non-wet manner by radio-frequency (RF) sputtering. This results in an overall multiple-layer structure such as pictured generally above chamber 26.

After deposition of the Mo, CIGS, and CdS, the strip proceeds through a sequence of operations, 23, 25, 27 designed to first divide, then subsequently, serially connect adjacent 'divided' areas. The first operation is to scribe through all deposited layers exposing bare, uncoated PI. This first scribe functionally divides the elongate strip of deposited layers into plural individual segments and thereby isolates each segment electrically. These segments are held together by the PI, which remains intact. The scribing technique used is a matter of choice, with the preferred method herein accomplished using a high power density laser.

Directly adjacent to the first scribe operation, a second selective scribe is conducted removing the CdS and CIGS layers but leaving the Mo intact in the as-deposited conditions. This selective scribe forms a via, or channel, that will be later filled in with a conductive oxide.

To prevent the conductive oxide in the top contact layer from 'filling in' the first scribe, Mo/CIGS/CdS, and in effect reconnecting adjacent divided Mo regions, the scribe must be filled in with an insulator. Preferably, this is accomplished with a UV curable ink deposited in operation 27 with a commercially adapted ink jet dispense head that is coincident with the high power density laser.

If the optional, electrically insulating, intrinsic-zinc-oxide (i-ZnO) layer is employed, this is prepared in processing chamber 28 to create a layer arrangement such as that pictured above chamber 28. In this layer arrangement, the i-ZnO layer is shown at 42, overlying the CdS layer.

A top contact layer in the form of a transparent, conductive-oxide overlayer 44, such as ITO or ZnO:Al layer, is formed in processing chamber 30, either directly upon CdS layer 40 in no i-ZnO layer is used, or directly on i-ZnO layer 42 where it is present. The resulting composite layer structure is indicated generally above chamber 30 in FIG. 1.

Where an insulating i-ZnO layer, such as layer 42, is created, the resulting overall layer structure includes what is referred to later herein as a sandwich substructure, indicated generally by arrows 46 in FIG. 1. Substructure 46 includes the i-ZnO layer sandwiched between the CdS layer and the zinc-oxide:aluminum (ZnO:Al) layer. Thus, where such a sandwich substructure is employed, a contiguous protective intermediary layer (i-ZnO) is provided interposed between the CIGS/CIS layer and the top contact layer 44.

Figure 3:
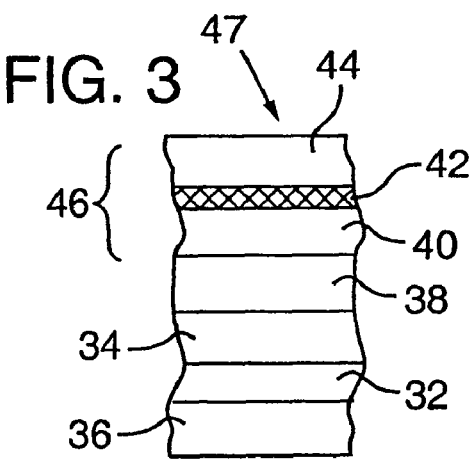
FIG. 3 is a further-enlarged, fragmentary, simplified cross section, taken generally along the line 3-3 in FIG. 1, illustrating one form of a multiple-layer construction that makes up a photovoltaic device.

FIG. 3 illustrates a PV-cell structure 47, such as produced from the process outlined in FIG. 1. It should be noted that the layer thicknesses are not drawn to scale. The specific layer arrangement which makes up device 47 includes, a stress neutralizing back side coating, a PI substrate 32, a stress compliant-intermediate coefficient of thermal expansion (CTE) Ni-alloy layer, oxygen-entraining and internally-compressed Mo layers 34, 36, CIGS or CIS layer 38, CdS layer 40, i-ZnO layer 42, and overlying, transparent conductive-oxide, ZnO:Al layer 44. This is a device wherein the option to employ i-ZnO has been elected. The sandwich substructure 46 mentioned earlier, which includes this i-ZnO layer, is identified with a bracket which bears reference numeral 46 in FIG. 3.

Figure 4:
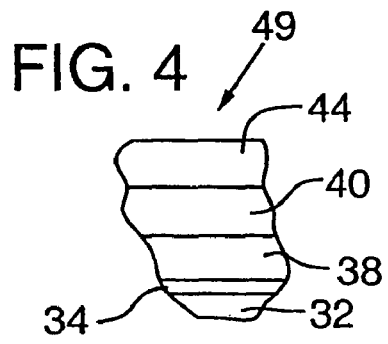
FIG. 4 illustrates an alternative photovoltaic device layer construction.

FIG. 4 illustrates the upper-layer portion of another PV-cell structure 49. Cell structure 49 differs from cell structure 47 by not containing an i-ZnO layer. Thus, in device 49, conductive-oxide layer 44 lies directly on and in contact with CdS layer 40. Those skilled in the art will recognize, and be familiar with, the particular kinds of applications or situations wherein a CdS layer alone can be utilized without the intermediary i-ZnO layer.

Figure 2:
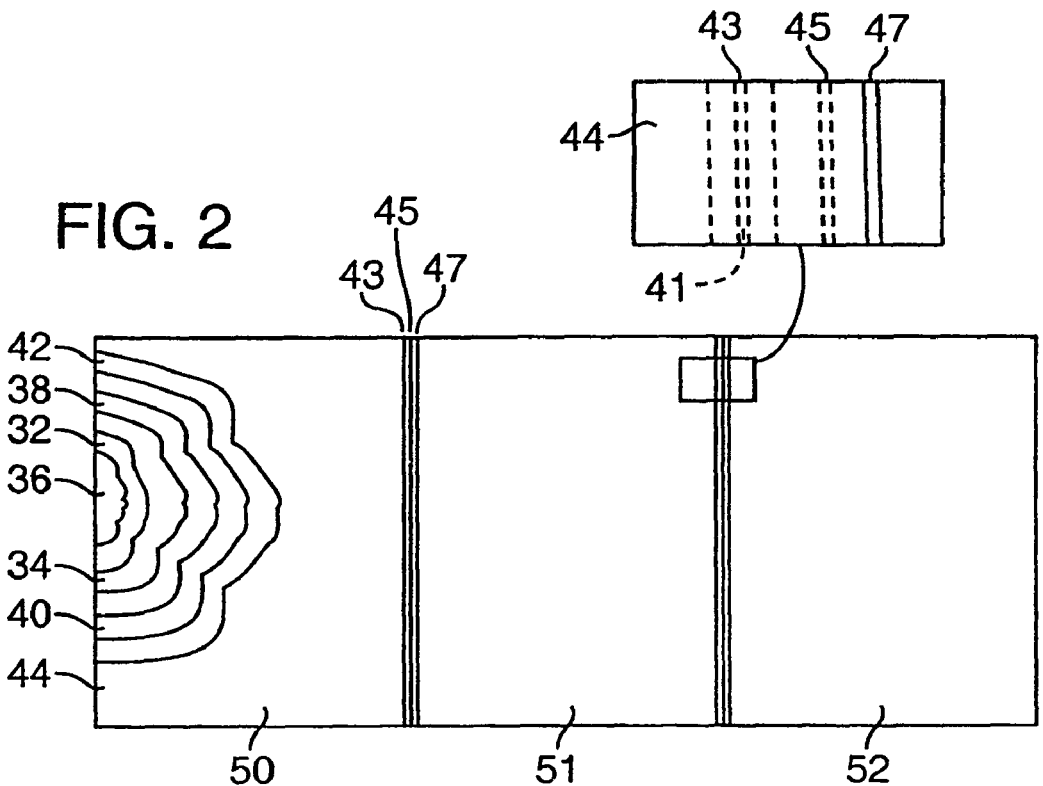
FIG. 2 is a fragmentary, plan view, taken generally in the direction of arrow 2-2 in FIG. 1, showing a piece of a roll of long and thin strip material employed in the disclosed system, with this piece being illustrated as containing portions of three boundary-defined, PV cells still resident in the strip material.

The product of the above-described process is a series of long narrow cells of active PV material monolithically interconnected along their edges such that the top of a cell becomes electrically connected to the bottom of the next cell. The result is a chain of cells electrically connected in series to generated a desired cumulative voltage for a given product application. The resulting plurality of edge-to-edge series interconnected, thin-film, flexible PV cells, are schematically depicted in FIG. 2 as 50, 51 and 52. These three cells are separated by lines that represent scribes 41, 45 and 47. Scribe 41 is overcoated with the ink-jet deposited, UV curable ink. Each of these cells has "plan" or "footprint" dimensions of about 33-cm by about 0.4 to 1-cm, most preferably in the range 0.5 to 0.6-cm. Representative scribes 41, 45, 47 are about 50 microns wide and extend the entire cell length of 33-cm. The ink-jet deposited insulator, 43, overlying scribe 41 has dimensions of about 50 to 200-microns wide, with the optimum dimension of about 80 to 125-microns, and extends the entire cell width of 33-cm. It should be noted that each of cells 50, 51, 52 in FIG. 2 includes the optional i-ZnO layer. The previously described layers in the module—PI substrate 32, Mo back contact layers 34 and 36, CIS absorber layer 38, CdS buffer layer 40, i-ZnO insulating layer 42, and ZnO:Al top contact layer 44—are illustrated as separated by the six cutaway lines in FIG. 2.

Monolithic integration creates a large building block, referred to as a submodule used to create a final module with desired voltage and current for the expected application. Building block size may be 30×30-cm, but is, of course, a matter of choice depending on the starting strip material size and the anticipated end-use of the product. At appropriate points in time during the overall processing procedure which has just been generally outlined in the 'monolithic interconnection' discussion, the functional electrical circuitry which is required in the end-product PV module structure is prepared. This circuitry establishes the needed electrical interconnects between adjacent submodules. The specific monolithic interconnection patterning configuration employed, and the technique(s) for creating such a configuration, are matters of choice, and are well known to those versed in the art.

Figure 11:
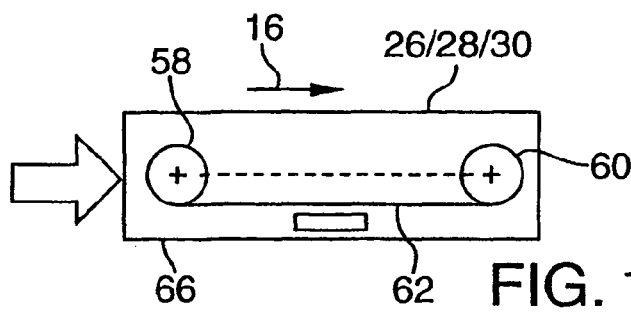
FIG. 11 illustrates two or three roll-to-roll chamber-processing steps. Specifically, FIG. 11 can be viewed as illustrating (a) a step of applying a layer of cadmium-sulfide (CdS), (b) a step, when employed, of applying a layer of intrinsic-zinc-oxide (i-ZnO), and (c) a step of applying a conductive-oxide layer, such as a zinc-oxide:aluminum (ZnO:Al) layer. This single-view, "multiple-purpose" drawing figure is employed in the interest of simplifying the overall collection of drawings.

FIGS. 5-8 and 10-14 each pictures schematically one of the processing chambers described generally above. It should be noted that the chamber pictured in FIG. 11 is readable to illustrate two or three of the processing steps performed in the practice of this invention, depending upon whether the optional i-ZnO layer is created. The enclosures forming the processing chambers are conventional in construction.

The short open arrows employed in FIGS. 5, 6, 11 and 12 represent various conventional hardware components that are involved in the introduction of substances and control parameters employed within the environment of the respective associated chamber. For instance, the arrow for chamber 22 represents the various conduits, valves, nozzles and controllers that are conventionally used to introduce the gas/vapor constituents utilized in chamber 22. Pay-out/take-up, roll-to-roll transport systems are also depicted schematically in these figures. The details of these systems are not illustrated, inasmuch as such details can take any one of a large number of different forms that are well known to those skilled in the relevant arts. Thus, appropriate guide rollers, tensioners, stationary guides, and other devices that would make up the construction, typically, of a suitable roll-to-roll transport system, are omitted from the drawing figures, and are not discussed herein in any detail.

Figure 13:
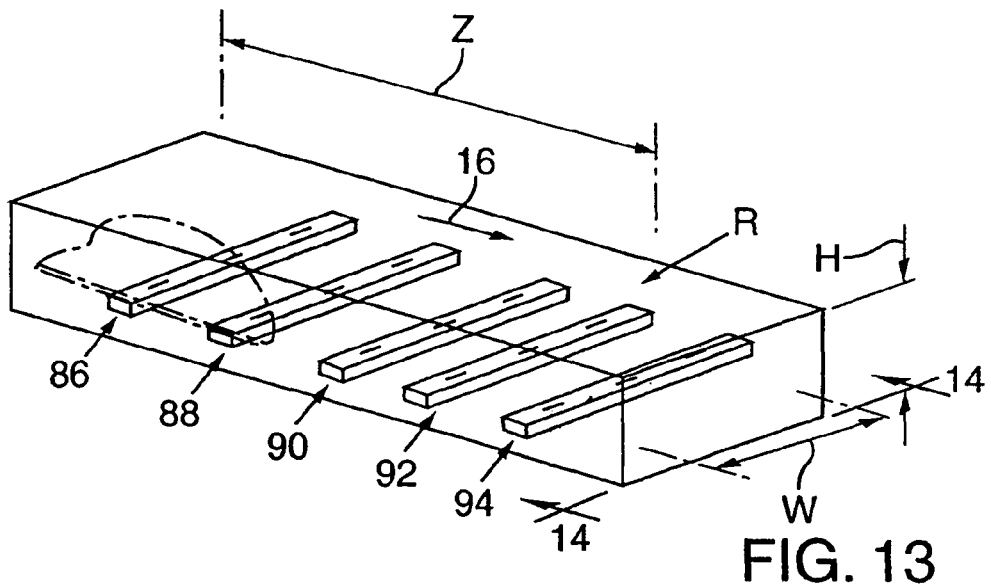
FIG. 13 is a schematic, perspective view of the chamber of FIG. 12.
Figure 14:
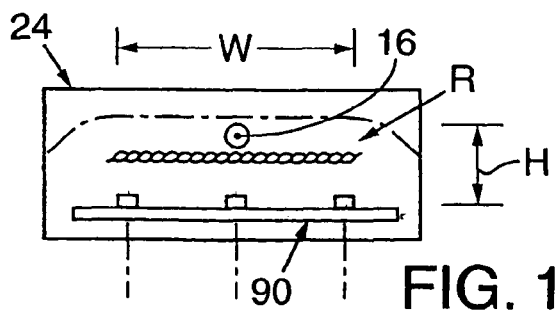
FIG. 14 is a schematic sectional view taken generally along the line 14-14 in FIG. 13.

Also pictured within the chamber-representing blocks shown in FIGS. 5-7 and 11, as well as in FIGS. 8, 13 and 14, are certain other schematically-represented, process-implementing components that play defined roles in the specific activities that take place within the respective associated chambers, as will be described below. Unprocessed strip material which pays out from roll 58 is initially heated to a temperature within the range of about 100° to about 500° C., and preferably to about 300° C. Heating drives unwanted moisture (water) out of the PI material in preparation for uniform back contact deposition. Heating is performed in a heating arena 63 sized in relation to strip transport speed to assure proper pre-Mo-deposition drying of the PI strip material. Heat is supplied in the heating arena by a pair of elongate, resistive, heating filaments, such as heating elements made available from the Omega Corporation, or from Watlow of Cleveland, Ohio. The elements are serpentine structures embedded in metal plates on the order of about 15-cm to about 150-cm in length, and most preferably about 60-cm long. Thus, at a web speed of approximately 30-cm per minute, each point on the PI strip material remains within the heating arena 63 for approximately two minutes. Commonly employed alternate processes such as direct current plasma treating may also be used to remove unwanted water from the polymeric strip material prior to back contact deposition.

Driving out moisture contained in the "starter" PI material and carefully monitoring and controlling the input of water vapor facilitates precise control over the process of entraining oxygen.

Processing proceeds with the back contact sputter deposited on the dried web in chamber 22. Two options exist, (1) first depositing the stress compliant layer in a separate chamber virtually identical to the chamber 22 or directly in line with the Mo deposition in chamber 22, or (2) depositing the Mo directly on the PI web. In either case, Mo is deposited on both sides of the PI strip and contains the oxygen entrapment.

Whether processing the Ni-based stress compliant layer or the Mo within chamber 22, a pay-out roll 58 of PI strip material, such as that identified earlier, feeds a downstream take-up roll 60, with a long reach or length 62 of this material extending between these two rolls. With a PI material having dimensions like those described above, the initial diameter of roll 58 is typically about 25-cm. Preferably, the long flat strip 62 which extends between rolls 58, 60 is maintained at a tension in the range of about 0.1- to about 10-kg, and preferably within the somewhat smaller range of about 1.0- to about 5.0-kg. Most particularly, a strip tension in this chamber of approximately 2.0-kg is suitable. The linear transport speed of the material within chamber 22 is generally between about 1-cm-per-minute and about 5 m-per-minute. A transport speed of about 30-cm-per-minute is typical. Transport speed, of course, can be varied as a matter of technical choice.

The environment within chamber 22 during processing is typically maintained at a controlled vacuum, ultimately, of approximately between 1.0 and 15 millitorr, but preferable 2-milli-Torr. Preferably, the interior of chamber 22 is evacuated initially to a pressure on the order of about $1.0 \times 10^{-6}$ Torr, whereupon argon gas is introduced until the pressure in the chamber rises to approximately the 2-milli-Torr level mentioned above. This pressure level is then maintained to within about plus or minus 0.5-milli-Torr, and preferably to within about plus or minus 0.1-milli-Torr.

After heat treating processing begins by transporting the dried polyimide material through chamber 22. Ni—V alloy has proven to be suitable for the metal interlayer. However any stress compliant metal, with a coefficient of thermal expansion (CTE) intermediate to that of the flexible substrate and the back electrical contact could be employed. Preferred materials are nickel based alloys that have enough alloying element to render the Ni non-magnetic but retain the Ni stress compliance, intermediate CTE, low bulk resistivity, and doesn't react with the overlying Mo. Examples include nickel alloyed with 0 to 10 weight percent vanadium, nickel alloyed with 0 to 15 weight percent molybdenum, and Ni alloyed with 0 to 7 weight percent chromium. Additionally, alternative metals that have the characteristic of intermediate CTE and low resistivity could be used. Examples include copper and copper alloys including brass, niobium, chromium, tantalum, and titanium.

In each of stations 64, 66, the Ni alloy source employed for the stress compliant layer sputter-deposition preferably takes the form of a 99.95% sintered Ni with 7 weight percent vanadium block, for example, which is commercially available from Pure Tech Inc., Carmel, N.Y. For this Ni-7V source material the sputtering cathodes are suitably (and conventionally) operated at power levels ranging from 1 to 10 kW each, with a 4.0-kW each being most preferable.

Figure 5:
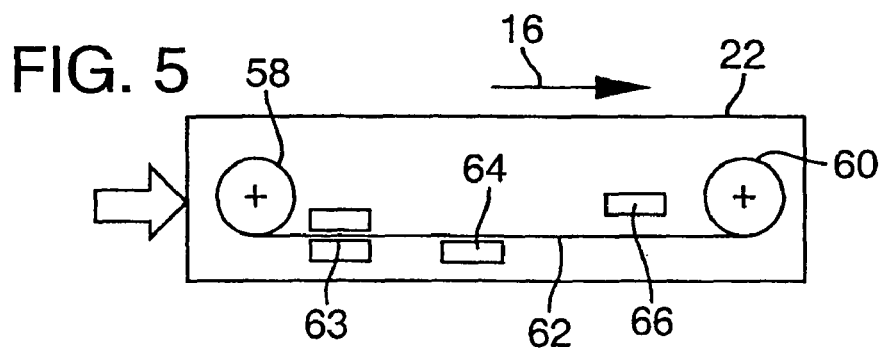
FIG. 5 is a simplified, schematic side elevation illustrating roll-to-roll, Mo-deposition, strip processing that takes place within one of the several, separated chambers that are employed in the production of a PV device constructed in accordance with the disclosed system.

Processing further proceeds with the formation/deposition of the two previously discussed Mo layers on opposing faces of the PI web. The Mo layers are formed by a Mo-deposition plasma generated inside the chamber 22 (FIG. 5). In each of stations 64, 66, the Mo source employed for Mo sputter-deposition preferably takes the form of a 99.95% pure vacuum arc cast Mo block, for example, one which is commercially available from Climax Specialty Metals of Cleveland, Ohio. For this Mo source material the sputtering cathodes are suitably (and conventionally) operated at power levels ranging from 1 to 10 kW each, with 4.0-kW each being most preferable.

In each of sputtering stations 64, 66, the spacing between the strip material and the Mo source material is arranged to be about 1- to about 20-cm, and most preferably about 10-cm. These spacing considerations play an important role in ensuring that the local deposition regions defined between the substrate and the Mo source material are especially suited to promote the introduction of appropriate compressive stress into the forming Mo layers. Within these regions, the pressure of argon gas increases and decreases, respectively, as the distance between the substrate and the sources decreases and increases. The preferable spacing distances and the chamber pressures stated above assure a condition in chamber 22 which causes the activity of argon atoms to promote a slight, but desirable, level of internal compressive stress in each of the two, forming Mo layers. It is believed that this compressive stress comes into being as a result of the fact that argon atoms "hammer" and effectively "ball-peen" the forming Mo layers. As described in more detail below, the internal compressive stress tends to counteract the tension imparted in the Mo layers that would otherwise occur as the strip is heated and the PI expands during the CIGS processing described later.

It is important to note that the use of conventional sputtering techniques for depositing a Mo layer on a PI substrate can result in a composite structure that is insufficiently ductile. That is, normal sputtering techniques will typically result in a Mo layer which is brittle, and which is therefore a likely candidate for fracturing and failure during subsequent processing steps.

We have found, as at least one component of the present invention, that a solution to this problem involves the addition of the mentioned entrained oxygen to the Mo layers. It is believed that the oxygen introduced into chamber 22 according to the present invention occupies the interstitial site of the BCC unit cell. Oxygen present at interstitial sites creates a higher level of internal compressive stress. Because the coefficient of thermal expansion of the PI is much greater that of the Mo, the high level of compressive stress is necessary to ensure the Mo remains in compression during heating in the CIGS chamber. If the Mo is not subject to enough compression, the thermal expansion mismatch between the PI and Mo would cause the Mo to transition into tension in the CIGS chamber and create cracking within the Mo. The introduced oxygen contributes to the act of creating internal compressive stress in the Mo layers. As a consequence, the Mo layers become more tolerant to bending and more resistant to cracking.

Thus, two principles are applied here to increase the compressive stress within the Mo: (1) the combination of low sputtering pressure and short target-to-substrate spacing creates reflected neutral argon peening which imparts and intrinsic high state of compression in the Mo film; and (2) the addition of oxygen to create a higher level of internal compressive stress in the Mo.

Under static vacuum conditions, i.e., while maintaining a closely controlled vacuum on the order of about 10 milli-Torr, within chamber 22, an oxygen/argon environmental condition develops with (as mentioned earlier) an optimum molar ratio of argon atoms to oxygen molecule on the order of between about 5-to-1 and about 50-to-1. Most preferably, this ratio is about 20-to-1. That is, for every 20-argon-atoms present within the chamber, approximately 1-oxygen-molecule exists; for every 15-argon-atoms within the chamber, there is approximately 1-oxygen-atom. With the environmental parameters established as above stated within chamber 22, the two, desired, oxygen-entraining Mo layers result with an appropriate level, in each layer, of compressive stress.

The resulting thickness of Mo layers 34, 36 can be monitored in any appropriate conventional manner as, for example, in an indirect manner by employing a standard Quartz Crystal Monitor (QCM) which can be configured to measure the rate of sputtering (rate of build-up) of sputtered materials in terms of angstroms-per-second, in situ. A suitable standard QCM is available from Liebold Inficom of Syracuse, N.Y. An end result thickness for this layer which has been found to be entirely satisfactory is about 0.5-micrometers, resulting in a layer sheet resistance of about 0.75-ohms-per-square.

Regardless of the precise physical mechanism(s) by which the presences of oxygen and argon cause these elements to assert themselves on, and in relation to, the formation of Mo layers 34, 36, important end results are: (a) that each of these layers bonds strongly to its associated PI strip face; and (b) that these layers are able to tolerate temperature changes that occur in subsequent processing without suffering temperature-induced cracking and fracturing. Additionally, layers 34, 36, disposed as they are on the opposite faces of the PI strip material, mechanically "balance" one another to inhibit product curling, or "bending out of plane." Such bending could be a problem and/or an inconvenience if only a single Mo layer were used. By way of example, the induced internal compression in a single Mo layer would be sufficient to curl the substrate to the diameter of a pencil without the balancing effect of the opposite layer.

Oxygen is preferably made available for entrainment into the Mo layers by controlled, variable-rate introduction of heated (for anti-condensation purposes) water vapor into chamber 22. Although there are several techniques available to those skilled in the art of sputtering, specifically, we have found that a vapor source mass flow controller as supplied by MKS Instruments of Boulder, Colo. is suitable mechanism for the introduction of the water vapor. Typical water flow rate is 0.1 to 10 sccm with a preferable range of 1.5 to 2.5 sccm. By maintaining in chamber 22 a molar ratio in the range of about 5:1 to about 50:1 for argon-to-oxygen atoms, appropriate entrainment of oxygen is attained, although values outside this range may give adequate results as well. Where, instead of using introduced water vapor, gaseous oxygen is employed according to a practice of the present invention, such oxygen is preferably delivered into chamber 22 from an external supply tank typically at approximately 10-$cm^3$-per-minute. Argon gas from an external supply tank is fed into chamber 22 preferably at a rate of about 200-$cm^3$-per-minute.

The heated and dried PI substrate is passed through first and second Mo sputtering stations, shown generally at 64, 66, respectively. It is within these two stations that oxygen is introduced to the forming Mo layers and argon acts with such added oxygen, to create a level of internal compressive stress within the Mo layers. The creation of this compressive stress is discussed in more detail above. In station 64, what can be thought of as the "back side" of the substrate (the upper side of stretch 62 in FIG. 5) is sputter-coated with Mo to create a layer like previously-mentioned layer 36. In station 66, the opposite (lower) side of the substrate is also so coated, here to create a PV-active Mo layer, like previously mentioned layer 34

When the entire strip of material has finished its processing transport within chamber 22, and has been collected on take-up roll 60, the latter is removed from chamber 22, and placed in chamber 24 (see now FIGS. 6-8, 10 and 12-14) to become the operative pay-out roll in that chamber. The strip material feeds in the direction of arrow 16 from pay-out roll 60 to a downstream take-up roll 68 in chamber 24. As the strip material moves through chamber 24, the absorber CIGS or CIS layer 38 is formed on Mo layer 34. A transport-guide structure (not shown) is employed between rolls 60, 68 in chamber 24 to support and guide the strip. The short, open arrow which appears at the left side of the block representation of chamber 24 in FIG. 6 symbolizes the hardware provided for the delivery of appropriate constituent substances to chamber 24.

It is within chamber 24, and specifically within a deposition zone R, that the unique molten-liquid-to-vapor co-evaporation process mentioned above for establishing a CIGS or a CIS layer is performed. FIGS. 6-8 and 10 illustrate schematically a configuration for, and certain environmental conditions within, the inside of chamber 24. Chamber 24 is designed specifically for the creation (according to one way of practicing this stage of the present invention) of a CIGS (rather than a CIS) layer. Accordingly, pictured as small blocks and tiny circles (FIG. 6 only) distributed along the bottom of chamber 24, are structures, designated 70, 72, 74, 76, 78, 79, 81, which function to generate vapors of copper (70), gallium (72) indium (74) and selenium (76, 78, 79, 81) for deposition. Structures 70-81 form the bulk of the vapor-deposition-creating system 83 of the present invention. One of the features that distinguishes this embodiment is that the vapor deposition environment created in Zone R is a continuum of evaporant fluxes as opposed a step-wise processes. Within Zone R, fluxes are held constant and by translation over the sources the receiving elongate substrate encounters a varying flux of material specifically designed to achieve optimum performance in the CIGS layer.

Blocks 70, 72, 74, which relate specifically to the vapor-delivery of copper, gallium and indium, respectively, represent heated effusion sources for generating plumes of vapor derived from these three materials. Each of these three effusion source includes: (1) an outer thermal control shield; (2) a boat, reservoir, or crucible containing the associated molten copper, gallium, or indium; (3) a lid that covers the associated case and reservoir, and that contains three vapor-ejection nozzles per crucible which assist in creating vapor plumes; and (4) a specially designed and placed heater located near the nozzles. Each such effusion source preferably comprises an elongate rectangular body disposed with its long axis oriented substantially orthogonally relative to the direction of strip-material travel in chamber 24.

Directing attention now particularly to FIGS. 16-19, along with FIG. 9, a description now immediately follows which explains the constructions of effusion sources 70, 72, 74 in more detail. Each of these effusion sources is substantially the same in construction. Accordingly, description now proceeds with reference made specifically (where appropriate) only to effusion source 70. At the onset of this description of effusion sources construction, we should note that other specific effusion sources configurations, with more or less than four principal parts, could be used if desired. The effusion source construction parameters set forth and referred to herein, should amply guide those skilled in the art toward the making and using of other, alternative effusion sources structures.

A thermal control shield is disposed external to the crucible and forms part of the effusion source. The shielding consists of two elements, (1) an outer shell, and (2) multiple layers of thermally insulating materials. Function of the outer shell is to restrict motion and hold in place the multilayer insulation. The shell can be constructed as either a four wall lid with a top that slides onto the crucible and shielding or as an four wall rectangular box with a bottom that the shielding and crucible insert into.

Suitable materials for the shell is limited to materials that can tolerate the high temperature vacuum environment in the presence of hot metal gases of copper, indium, and gallium, as well as the reactive selenium. Successfully employed materials for the shell have included graphite, boron nitride, tantalum sheet, molybdenum sheet, tungsten sheet, rhenium sheet, and titanium sheet. Additional acceptable shell materials include the before-mentioned materials coated with a protective ceramic film such as pyrolitic boron nitride, alumina, and titanium diboride. The material should be chosen to provide sufficient thermal insulation and stability in the reaction zone. A particularly suitable material is a graphite shell.

Each of effusion source shells 100 has a length dimension herein of about 45-cm, a width dimension (measured along the long axis of chamber 24) of about 7-cm, and a height dimension of about 7-cm. Length and width can be either proportionally or non-proportionally scaled to match the ZONE R and substrate with dimensions, and are matters of choice. From longitudinal centerline-to-centerline of adjacent effusion sources, a preferred-distance is about 8.9-cm. Similar to the effusion source size the centerline-to-centerline spacing can be adjusted to the ZONE R dimensions and to the substrate width and are matters of choice. However, from a "plan view" perspective of the effusion source nozzle organization, this structure is generally centered with respect to the footprint of ZONE R.

Moving closer to the crucible is a multi-layer insulation that shields the high temperature sources operating at 1000 to 1700° C. from other items in ZONE R, including the walls that define ZONE R. Among other things the most important function of the shielding is three-fold, (1) to reduce the electrical power requirements necessary to maintain the source at the elevated temperature for extended time periods, and (2) to minimize radiative thermal load and subsequent heating of the surround components in zone R, and (3) eliminate thermal 'cross talk' between adjacent sources operating at substantially different temperatures.

Within a vacuum where the key thermal transport mechanism is radiation (as opposed to convection or conduction), effective shielding consists of several layers, preferably with a low emissivity. Generally, the CIGS effusion source shielding should offer, (1) thermal stability at temperatures from 1000 to 1700° C., (2) stable and consistent thermal properties, (3) stability in vacuum in the presence of gaseous metals and selenium, and (4) stable when in contact with the shell, crucible, and lid materials. Successfully employed materials for the effusion source shielding have included graphite felt, graphite foil, ceramic felt, boron nitride sheet, tantalum sheet, molybdenum sheet, tungsten sheet, rhenium sheet, and titanium sheet all of which are commercially available from several vendors. The selected material should provide thermal insulation and stability in the reaction zone and multiple layers of graphite felt and graphite foil have proven particularly suitable. Three felt layers 101 and nine foil layers 103 in a alternating sequence starting at the crucible of felt, three foils, felt, three foils, felt, three foils provides a suitable specific configuration.

Inserted in a somewhat nested condition within the walls of case 100, and formed of pyrolitic boron nitride coated graphite, is an elongate boat, reservoir, or crucible, 102 which is generally rectangular in form, and which includes a base 102a, a pair of elongate side walls 102b, 102c which join with base 102a, and a pair of end walls 102d, 102e which join with the reservoir base and side walls. Although pyrolitic boron nitride coated graphite is the crucible material of choice, several materials are suitable for the crucible including metals of tantalum, molybdenum, and tungsten, several forms of uncoated graphite, and other thermally and vacuum stable ceramics such as alumina, sintered boron nitride and titanium diboride. Additionally, the crucible can be formed from a combination of the above-mentioned materials coated with a thermally stable coating, CTE matched to the crucible material, such as pyrolitic boron nitride, alumina, and titanium diboride. As can be seen especially in FIG. 17, end walls 102d, 102e, as such appear in this figure, have thicknesses, of about 0.125-inches, with side walls 102b, 102c having a somewhat smaller thickness of about 0.1-inches. Base 102a has a thickness of about 0.1-inches. End walls 102d, 102e each has a pocket-like void space (only one being shown), such as void space 102f in wall 102e, which void space is somewhat planar, with the plane of this void space being substantially normal to the plane of FIG. 17 The role of the pocket is to improve the temperature uniformity of the molten metal within the crucible. The pocket improves thermal uniformity by reducing the thermal transport by conduction to the end of the crucible where heat is radiated to the shielding. Formed in base 102a, and opening to the outside surface of end wall 102e, are two laterally-spaced elongate bores (no reference numbers shown) which receive two elongate temperature-monitoring thermocouples such as thermocouples 104, 106 pictured at the lower side of FIG. 18.

Figure 17:
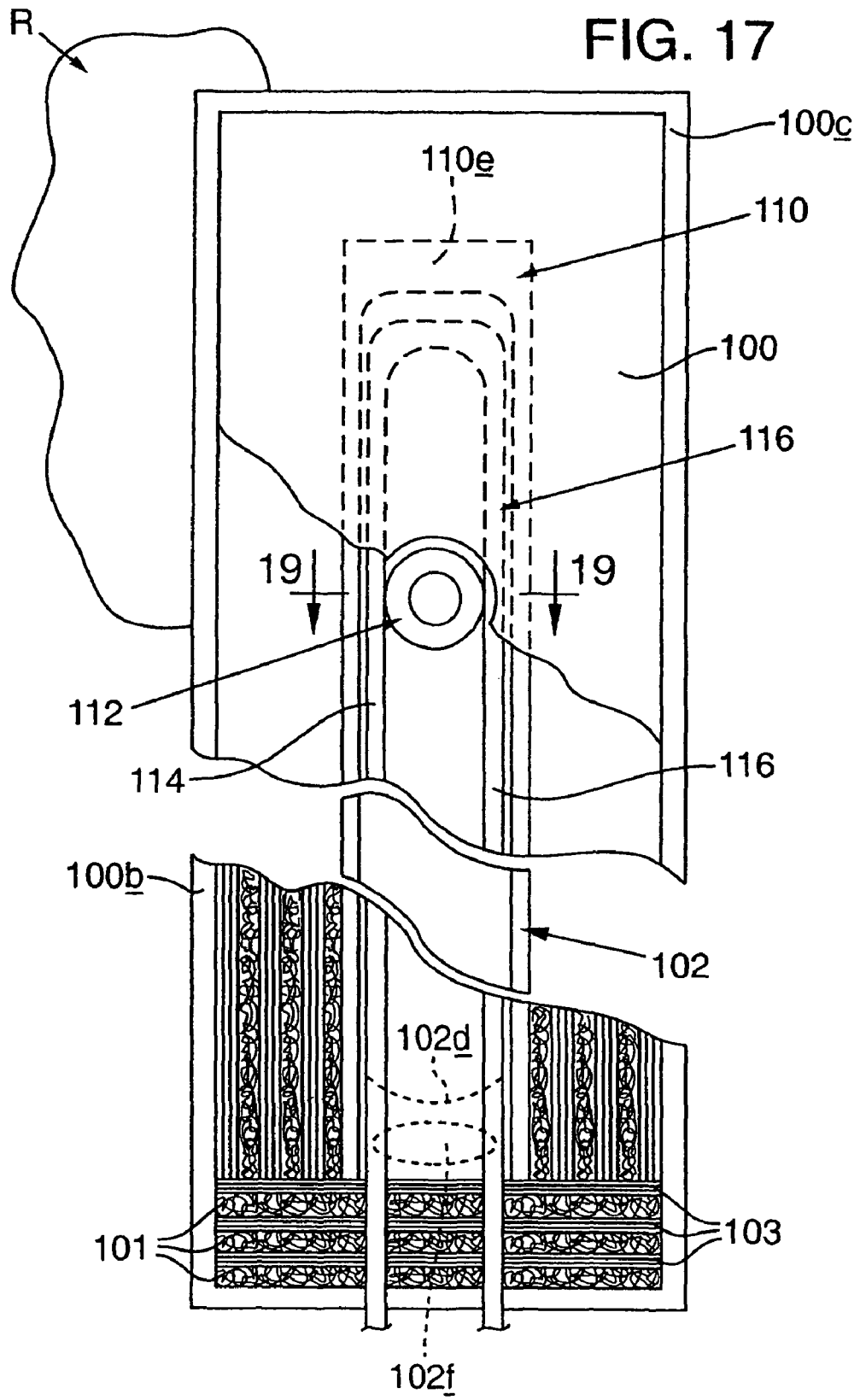
FIG. 17 is a fragmentary plan view illustrating portions of one of the nozzle-bearing crucibles pictured in FIGS. 6-16 employed for the delivery of copper, gallium and indium vapors.

The lower end of crucible 102 in FIG. 17 essentially occupies the previously-mentioned open end of case 100, through which open end the reservoir can be inserted and removed relative to what can be thought of as the inside volumetric space provided in case 100. This reservoir includes an elongate central deep well 102g that receives and contains molten copper—such molten copper being indicated at 108 in FIG. 18.

Figure 18:
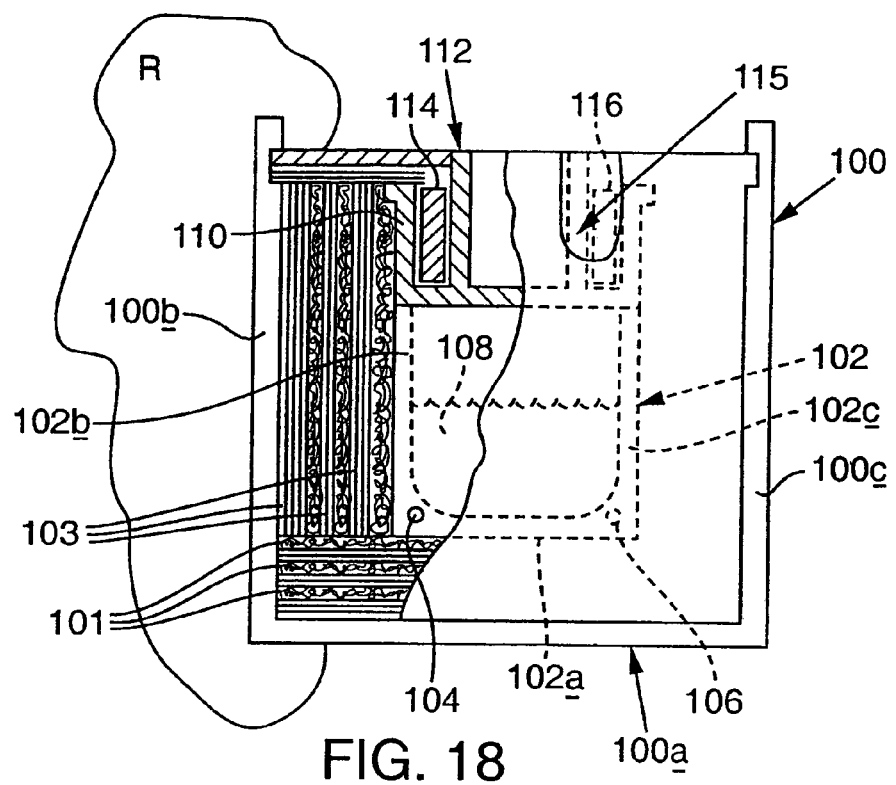
FIG. 18 is an end elevation taken from the bottom side of FIG. 17, also with certain regions broken away to show inside details.

Fitting snugly within the upper portions of previously-mentioned crucible walls 102a, 102b, 102c, 102d is an elongate lid 110 formed of graphite. The wall thickness of the material making up lid 110 is about 0.1-inches. Suitably formed in the upper part of lid 110, i.e., in that part in the lid that faces the viewer in FIG. 17, and which is near the top of FIG. 18, are the three previously mentioned, spaced vapor-delivery nozzles, such as nozzle 112 pictured in FIGS. 17 and 18. The nozzles are essentially unitary with lid 110. In the preferred embodiment, the nozzles are integrally machined into the lid and are formed of graphite, however, nozzles constructed of sintered boron nitride, pyrolitic boron nitride coated graphite, and many refractory metals such as molybdenum, tantalum, and tungsten have been constructed. Nozzles formed of materials different from the machined lid are inserted into matching holes in the graphite lid.

The nozzles lie in a common vertical plane which substantially contains the long axis of vessel 70, with the central nozzle being substantially centered relative to the opposite ends of the lid, and the two end nozzles having their axial centerlines each spaced from that of the central nozzle by about 15.0-cm. Nozzle spacing can be adjusted based on the source-to-substrate spacing using methodologies described later in this disclosure. In brief summary, as the source-to-substrate space increases, the nozzles spacing increases, and conversely, as the source-to-substrate spacing decreases, the inter-nozzle spacing increases. Typical inter-nozzle spacing range from about 1 to 20 cm. The discharge tips of the nozzles lie preferably in a common plane, which plane substantially parallels the plane of the path followed by the expanse of strip material passing through zone R. This nozzle-tip plane is spaced from (above) the substrate-transport plane in chamber 24 from 10 to 25-cm but most often at about 18-cm.

Figure 19:
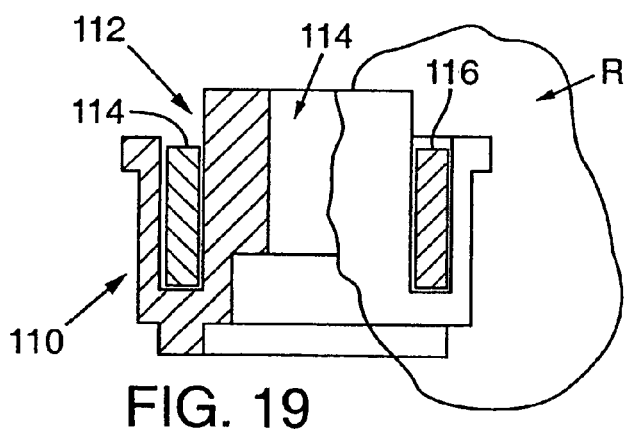
FIG. 19 is an enlarged, fragmentary cross section taken generally along the line 19-19 in FIG. 17, showing details of a vapor-plume-generating nozzle in the crucible pictured in FIGS. 9 and 16-18.

Nozzle 112 (typical of all of the crucible nozzles) is shown in an enlarged and more detailed manner in FIG. 19. Here, one can see that this nozzle includes an outlet port 114 which is generally cylindrical with a wall 115, and which possesses an axial length (the vertical dimension of port 114 in FIG. 19) of about 0.95-cm, and a diameter, pictured as the horizontal dimension of the port in FIG. 19, also of about 0.95-cm. The discharge openings in the nozzles each preferably has a diameter within the range of about 0.25-cm to about 2.5-cm, and a depth, measured normal to the plane of FIG. 17, which preferably lies in the same range. The diameter and depth dimensions are preferably about equal.

Extending appropriately into lid 110 from the upper end thereof in FIG. 17, and through previously mentioned bores, are two, elongate, conventional electrically-energized heating elements 114, 116, respectively. These heating elements, which are formed preferably of pyrolithic graphite lie in appropriate slots machined in the graphite lid. Several refractory metals such as tantalum, molybdenum, and tungsten have also been successfully used as the effusion source heater(s). As shown in FIGS. 17 and 18, heater elements 114 and 116, are connected at a distal end to form a single continuous heating element integrally embedded in the lid adjacent opposing sides of the nozzles. As shown in FIG. 18, heating elements 114 and 116 form the only heater in the vessel. By providing substantially all heat to the vessel from the lid, particularly emanating from around the nozzles, in conjunction with the insulated wall configuration shown in the Figures, molten material is readily evaporated from the vessel without condensing material in or around the nozzle openings. As a result in part of the heater configuration, the respective lids and nozzles in each of crucibles 70, 72, 74 remain and operate at temperatures which are higher than the temperatures of the associated molten materials within the crucible and the nozzle openings remain clear with constant diameters providing uniform evaporative effusion over prolonged deposition manufacturing periods.

The entire effusion source arrangement with the exterior shell, shielding, and spaced exposed nozzles, produces proper deposition of the CIGS materials, while at the same time protecting the strip material from overheating, and substantially eliminates undesired condensation of metal vapor liberated from the boats in the regions of the openings of the nozzles. The traveling strip material, while directly exposed to the individual heated nozzles, is shielded from direct exposure to the molten source materials. While two elements are shown herein, more or less in number could be used. For example, a single, generally U-shaped heating element having two long runs leading to a reverse bend within the crucible could be employed. U-shaped is the preferred method because it allows the heater to be rigidly mounted to the electrical energy source on one end, allowing the other end to freely move as a result of thermal expansion, in affect, representing a roadway bridge. Hard mounting the electrical source on both ends would likely cause excessive deformation of the heating element due to thermal expansion, leading to premature failure.

Figure 31:
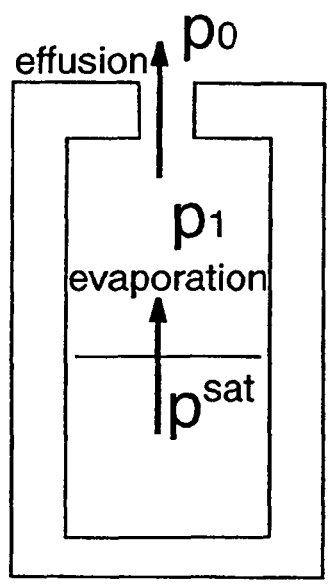
FIG. 31 pictorially illustrates flow of a vapor through an orifice.
Figure 32:
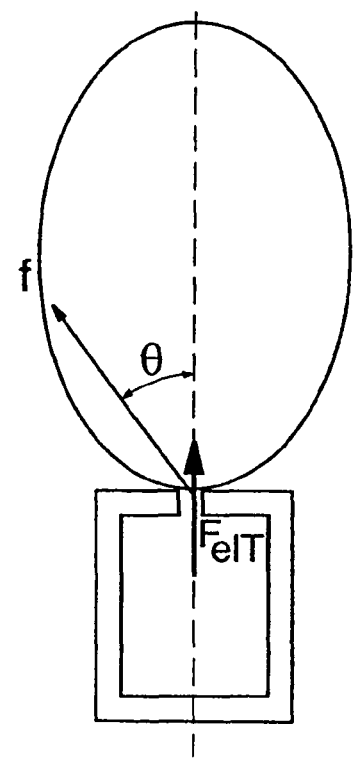
FIG. 32 depicts the molecular beam profile from an effusion source.

FIG. 10, in dashed lines, shows representative plumes 70a, 72a which emanate from effusion sources 70, 72, respectively, as if to form, nominally, what we sometimes refer to as a vapor-tufted environment, such as was generally mentioned earlier. Use of the word "tufted" herein is made simply to evoke visualization of how a co-mingled deposition-vapor fog comes into being in chamber 24. The copper, gallium and indium vapor plumes that exist during CIGS deposition in chamber 24 are thought to be a vector quantity in the shape of the form $\sin^2 \theta$ as shown in FIG. 32. Effusion from a single orifice source is essentially the sum of two processes. The first of these is the evaporation of the source material, the second is the flow of the vapor through the orifice as pictorially shown in FIG. 31. Each of these processes provides a "resistance" to the effusion of the source material. Evaporation of the source materials will be described later.

The theory of low-pressure gas flow though an orifice is well understood and can be predicted to within 5 or 10%. Within a vacuum there are two regimes in which low pressure gas flow occurs: (1) the free molecular and (2) transitional flow regimes. In qualitative terms, the free molecular regime describes gas flow in which gas phase collisions are rare enough that only molecule-wall collisions are significant. Transitional flow describes a situation where molecule-molecule collisions occur frequently enough to affect the flow behavior, but do not occur frequently enough to be described accurately by the full viscous flow model as would be used at near atmospheric pressure.

The determination of the applicable flow regime is achieved by calculating the Knudsen number:

$$Kn = \frac{\lambda}{\Gamma} \quad \text{(eqn. 1)}$$

where $\lambda$ is the mean free path and $\Gamma$ is the orifice radius. If $Kn>1$, the system is in the free molecular regime and the mass flow rate is described by the following equation:

$$F_{eff} = \pi \Gamma^2 K \left(\frac{M}{2\pi RT}\right)^{\frac{1}{2}} (p_1 - p_2) \quad \text{(eqn. 2)}$$

where F is the mass flow rate through the orifice, M is the molecular weight of the gas molecules, R is the ideal gas constant, T is the temperature, and $p_1$ and $p_2$ are the pressures on either side of the orifice. K is an empirically determined constant which is a function of the aspect ratio (L/$\Gamma$ where L is the orifice length) of the orifice. For L/$\Gamma$ less than 1.5, K is given by $$K = \frac{1}{1 + 0.5\frac{L}{\Gamma}} \quad \text{(eqn. 3)}$$

For L/$\Gamma > 1.5$, $$K = \frac{1 + 0.4\left(\frac{L}{\Gamma}\right)}{1 + 0.95\left(\frac{L}{\Gamma}\right) + 0.15\left(\frac{L}{\Gamma}\right)^2} \quad \text{(eqn. 4)}$$

In the case of $0.01<Kn<1$, there are two equations which must be solved for both F and p':

$$F_{eff} = \pi \Gamma^2 C \left(\frac{M}{2\pi RT}\right)^{\frac{1}{2}} (p_1 - p') \quad \text{(eqn. 5)}$$

$$F_{eff} = \frac{\pi \Gamma^4}{16 \mu L} (p'^2 - p_2^2)\left(1 + 4\left(\frac{2}{f_d} - 1\right)\frac{\lambda}{\Gamma}\right)\left(\frac{M}{RT}\right) \quad \text{(eqn. 6)}$$

where $\mu$ is the viscosity, $f_d$ is the fraction of molecules diffusely reflected from the walls ($0.85 \leq f \leq 1$), and C is a constant (C=20).

After determining the mass flow rate, $F_{eff}$, through the orifice it becomes necessary to describe the flux intensity profile of the effusing beam, that is, to determine $f=f(r, \theta)$, where f is the flux, r is the distance from the effusion orifice, and $\theta$ is the azimuthal angle.

An equation describing the flux as a function of $\theta$ and the rate of effusion is obtained by setting the rate of effusion equal to the integral of the flux over a hemispherical area. Assuming that the flux can be approximated by $f=a \cos^n \theta$ $$F_{eff} = \int_0^{\frac{\pi}{2}} \int_0^{2\pi} a \cos^n \theta (r^2 \sin\theta) \partial \xi \partial \theta \quad \text{(eqn. 7)}$$

After solving for a in eqn. 7, $$f = \frac{F_{eff}(n+1)}{2\pi r^2} \cos^n \theta \quad \text{(eqn. 8)}$$

Although the a priori prediction of a value for n is not completely well defined, a safe approximation for both transitional flow regimes and free molecular regimes of L/D=1 is n=2. The molecular beam profile is depicted in FIG. 32.

Effusion rate from a given nozzle is a function of vapor pressure within the inside of the associated crucible, and that this pressure is a function of the temperature of the molten material inside the reservoir in that crucible. Thus, for a particular, selected nozzle size, the effusion rate to be expected is essentially a function of the temperature within the crucible.

Predicting the rates of effusion of the copper, gallium, and indium sources is a straightforward solution of the equations above. The temperature-vapor pressure data of the three elements are easily found in literature and can be approximated by:

Cu: $\log P_{Cu}^{sat} = -19.818 + 2.0643 \times 10^{-2} \times T - 5.2119 \times 10^{-6} \times T^2$ (eqn. 9)

Ga: $\log P_{Ga}^{sat} = -17.2982 + 2.0829 \times 10^{-2} \times T - 6.0 \times 10^{-6} \times T^2$ (eqn. 10)

In: $\log P_{In}^{sat} = -16.238 + 2.1427 \times 10^{-2} \times T - 6.7885 \times 10^{-6} \times T^2$ (eqn. 11)

where pressure is in torr and temperature is in ° C.

Figure 24:
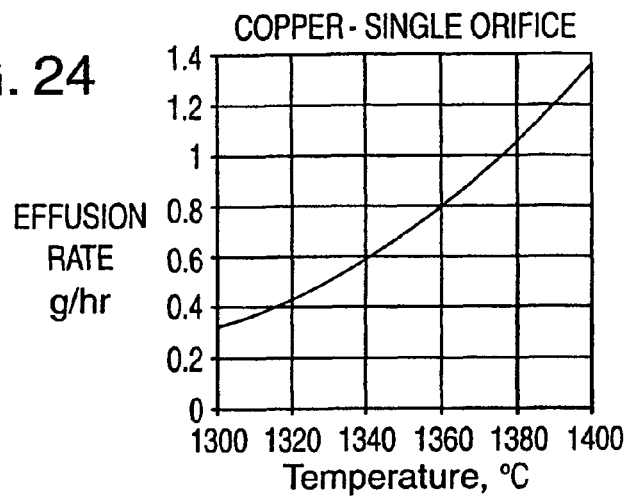
FIGS. 24, 25 and 26 present graphs that relate the effusion rates (in grams per hour) as a function of molten-material temperature for copper, gallium and indium, respectively.
Figure 25:
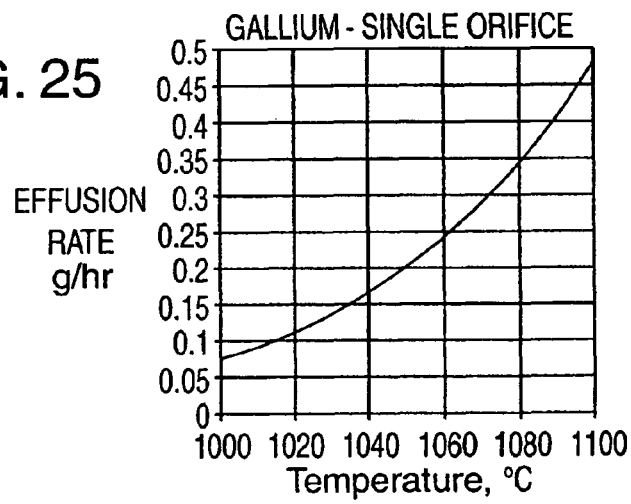
Figure 26:
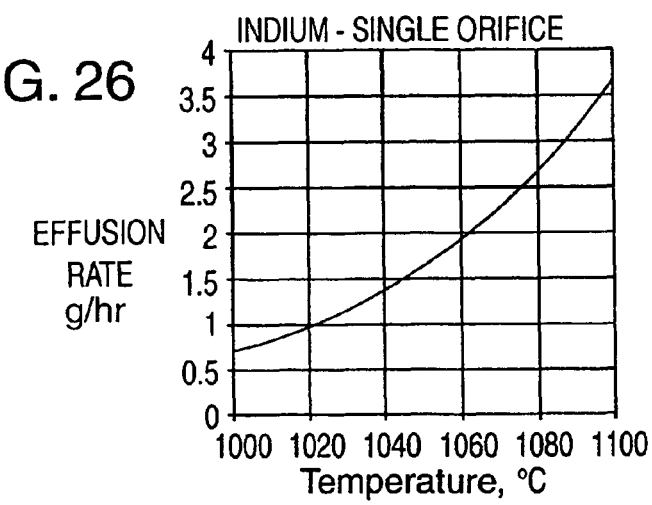

FIGS. 24-26, graphically picture the respective effusion rates of copper, gallium and indium that we have observed with respect to nozzles constructed in accordance with the descriptive information given above. These graphs relate to effusion rate (grams-per-hour for different molten-material temperatures) with respect to the activity of a single nozzle. In particular, FIGS. 24-26 illustrate the effusion rate of copper, gallium, and indium as a function of temperature for an orifice 0.9525-cm in diameter and 0.9525-cm in length. The copper, indium, and gallium sources all operate in the free molecular flow regime. It is also noteworthy that the evaporation process in these cases is responsible for <5% of the resistance of the total effusion process. That is, the orifice geometry is the overwhelming factor in determining rate of effusion.

Further application of the above principals reveals that the vapor flux incident at the deposition surface presented in chamber 24 is, essentially, a function of the temperature within a selected crucible, the distance between that crucible and the intended deposition surface, and the angle between a point on the substrate and the effusion source nozzle. Accordingly, it will be apparent that, for a fixed distance being decided upon to exist between the crucibles and the traveling strip material in chamber 24 traveling at a constant speed, the amount of metal vapor (collectively) incident at the deposition surface of the traveling strip material is essentially a function of the temperature of the molten materials within the crucibles.

Thus, it should be very apparent, that, by carefully controlling the temperatures of the molten materials within crucibles 70, 72, 74, and by maintaining substantially constant the transport or travel speed of the strip material in chamber 24, the rate at which metal vapor from each crucible is applied to the appropriate deposition surface of the traveling strip material can be controlled readily to produce uniform thin-layer deposition thickness along the length of such material.

In accordance with a preferred embodiment of the system of the present invention, the molten temperature of copper within crucible 70 is suitably maintained in the range of about 1400° C. to about 1700° C., and most preferably at a temperature of about 1565° C. (+/− about 1° C.). The temperature of the molten gallium within crucible 72 is suitably maintained within the range of about 1000° C. to about 1350° C., and most preferably at about 1225° C. (+/− about 1° C.). Finally, the temperature of the molten indium within crucible 74 is most appropriately (according to what we have learned in our practice of use of this invention) maintained in the range of about 950° C. to about 1300° C., and most preferably at about 1205° C. (+/− about 1° C.). The temperature of molten selenium in reservoir 85b is preferably maintained in the range of about 275° C. to about 500° C., and most preferably to about 415° C. (+/− about 10° C.). Although these temperatures are in the preferred range for the disclosed sources with 0.95-cm orifices, the rate restricting nozzle principals outlined herein indicated that as the orifice size increases, the temperature would decrease to achieve a constant rate, or alternatively, as the orifice decreases, the temperature would increase to achieve a constant rate.

It should be noted that, although the effusion rate (and hence the flux) of selenium vapor is quite sensitive to changes in temperature in the body of molten selenium in reservoir 85b, changes in selenium flux over time do not appreciably affect the formation of the end-result CIGS/CIS layer because the chamber is already essentially saturated with selenium.

By carefully controlling the vapor effusion rates from the nozzles in crucibles 70, 72, 74, and from those in the sparger tubes, for example by proper dimensioning of the respective collections of nozzles, and further by carefully controlling the temperatures of the molten metals within the reservoirs in the crucibles and in the selenium delivery structures, and thereby effectively controlling the pressures within these crucibles and the "selenium structures", the desired effusion characteristics of the generated vapor plumes may also be carefully controlled. Coupling to these considerations, the further considerations of (1) selecting an appropriate number of nozzles for each vapor-delivery crucible and sparger tube, (2) appropriately positioning the nozzles in the lids of the respective crucibles and in the sparger tubes, and (3) carefully arranging the overall disposition layout of the crucibles and sparger tubes, an optimum aggregate multiple-plume configuration can be obtained.

The particular positionings and sizings of the nozzles present in chamber 24 as described herein, with each of the nozzles having substantially the same configuration as each other nozzle, produces a preferred arrangement in chamber 24 for the deposition of our desired CIGS/CIS layer. From a reading of plume geometry principles described herein, coupled with a careful review of the specific design considerations so far described herein for the layouts of the crucibles and their nozzles, those skilled in the art will see that careful selection of the size and number of orifices for each such kind of crucible can produce substantially any desired, and substantially transversely uniform, vapor flux across the width of a deposition surface, which uniformity will result in a substantially uniform layer thickness throughout the resulting deposited thin-film layer.

The flux seen at a surface is a function of both the intensity of the incident flux and angle of incidence. As the angle of incidence, φ here defined as the angle between the surface normal vector and flux vector), increases, the deposition flux seen by the surface decreases as the cosine of the angle of incidence.

$$f_{dep} = f \cos \phi \qquad \text{(eqn. 12)}$$

Combining equations 11 and 12, we obtain an expression for the deposition flux at a point on a surface due to a single source:

$$f_{dep} = \frac{F_{\mathit{eff}}(n+1)}{2\pi r^2} \cos''\theta \cos\phi \qquad \text{(eqn. 13)}$$

Figure 33:
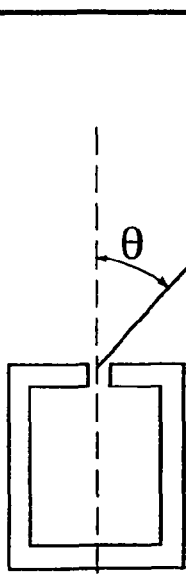
FIG. 33 illustrates the parameters of equation 14.

If the centerline of the source orifice is parallel to the surface normal vector (i.e. the source is not tilted—See FIG. 33), eqn. 13 reduces to $$f_{dep} = \frac{F_{\mathit{eff}}(n+1)}{2\pi r^2} \cos^{n+1}\theta \qquad \text{(eqn. 14)}$$

Knowing the molecular weight, MW, and density, ρ, of the material being deposited, the rate of growth, δ, (thickness/time) at a point on the substrate surface is written as:

$$\delta = \frac{F_{\mathit{eff}}(n+1)}{2\pi r^2} \cos^{n+1}\theta \times \frac{MW}{\rho} \qquad \text{(eqn. 15)}$$

Figure 34:
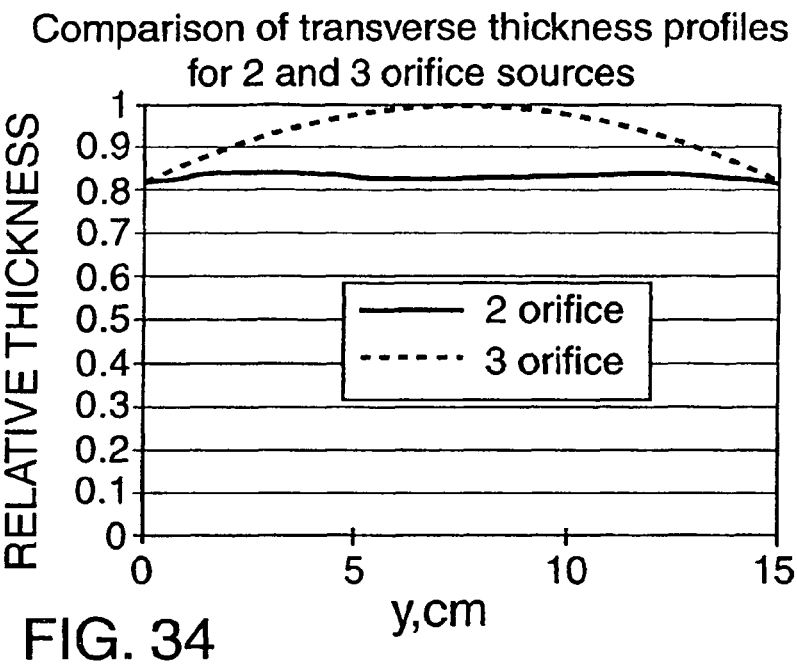
FIG. 34 illustrates transverse thickness profiles for two and three orifice systems.

By applying the equations outlined above, the cumulative flux distribution of several nozzles within a single source can be determined, and subsequently the nozzle spacing can be determined as discussed early in the document during the detailed disclosure of the effusion source dimensions. FIG. 34 graphically pictures the respective effect of overlapping plumes for two and three nozzles within a 15-cm span of a single effusion source. This graph shows the optimum nozzle spacing is approximately 15-cm as disclosed earlier.

Further regarding these nozzles/discharge openings, under certain circumstances, it may be desirable to construct and employ, for one or more of the several deposition materials, discharge orifices which have different discharge diameters or shapes. In other words, a given vessel or boat for a particular deposition material may have associated with it plural orifices with different discharge diameters or shapes. Orifice discharge diameter plays an important role, inter alia, in defining certain aspects (for example, vapor-discharge volume per unit of time) of its associated discharge vapor plume.

Figures 27, 28, 29:
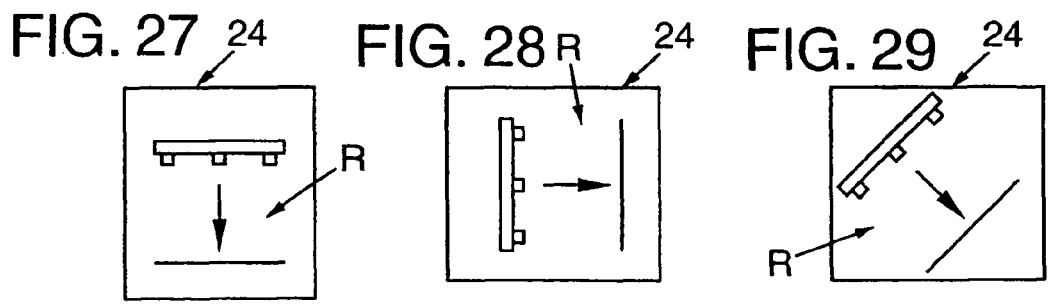
FIGS. 27, 28 and 29 in a simplified schematic manner, illustrate several alternative ways in which deposition fog that is produced by employing the vapor-plume apparatus of the present system can be "delivered" (in a directional sense) for creating a thin-film layer on a surface in a strip of reception material.
Figure 30:
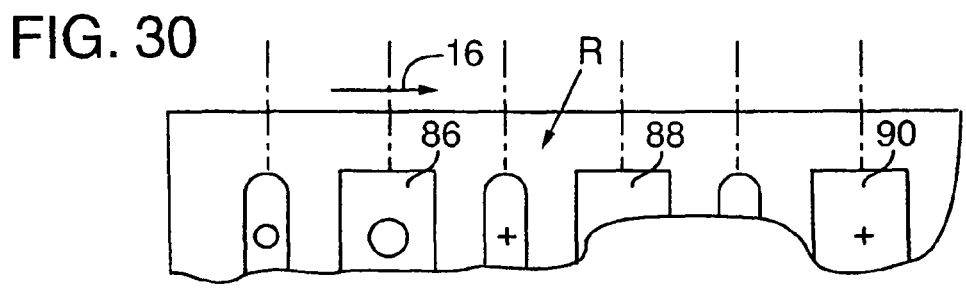
FIG. 30 is a fragmentary plan view illustrating portions of the vapor-delivery system in the chamber of FIGS. 12-14.

Those skilled in the art will recognize, accordingly, that certain aspects of discharge behavior can be adjusted to suit particular needs and circumstances through suitable adjustments made in nozzle characteristics. In addition, it is possible to have the effusion sources supply materials in a downward, lateral or oblique orientation to the substrate, as shown in FIGS. 27-29.

It should be noted that, although the disclosed embodiment utilizes separate chambers, it is also possible to combine two or more of the processing steps into a single chamber. However, separate chamber processing offers a number of advantages. The layers of CIGS (Mo, CIGS, CdS, i-ZnO, and ITO) consist of several very mobile atoms when in a gaseous form in a vacuum where the mean free path is long, especially selenium, sulfur, cadmium, zinc, and tin. This mobility is primarily related to high vapor pressures even at moderate temperatures. Cross-contamination of one element in another processing zone can dramatically alter (negatively) the properties of the layer. In in-line glass lines, several isolation lock chambers are used to prevent cross contamination. An individuated plate of glass is moved into the lock from the upstream deposition zone while a valve isolates the lock from the downstream processing zone. Once the plate is fully in the zone, the valve is closed between the lock and the upstream zone, the vacuum environment is stabilized to the downstream zone, and then the valve to the downstream zone is opened. The lock chambers usually also contain special provisions to preferentially pump constituents (i.e., Se, water) that reside in the processing zones on either side of the lock chamber. This approach is not technically practical with a fully continuous roll to roll process, especially one in which only the backside of the web is contacted with rollers. It is done in some instances when applying hard coatings to flexible substrates but these systems usually contain nip rolls or thin membranes that drag on the coated side of the substrate to create a seal (i.e., the back of the strip is sealed with a roller and the front is sealed with a roller or dragging membrane. However, it is preferable not to contact both sides of the web.

Separate chambers are also beneficial because of the substantial differences in environment between separate zones, i.e., Mo is typically done at ~1.5 mtorr with argon and water, CIGS is typically done at 0.001 mtorr with no argon or water, CdS is typically done at 2 mtorr with just argon. With a combined chamber, a lock is used to stabilize the environment before the valves separating the zones from the lock is opened. For example, as the lock chamber is brought to the pressure of the Mo zone, the valve separating the Mo zone from the lock is opened. Bringing the two zones to the same pressure is important to prevent a pressure surge in the Mo zone. The valve between Mo and the lock is closed, the lock is pumped to the pressure of the CIGS processing chamber, and then the valve between the lock and the CIGS zone is opened. Such an arrangement adds considerable unnecessary complexity to the system.

Another advantage of separate chamber processing is that downtime for unscheduled maintenance for repair does not take down the entire plant. This is particularly important where there are several chambers installed for each layer because even if one CIGS is down, for example, the entire plant is not down. In addition, scheduled downtime for source replenishment does not require stopping an entire line. It is also easier to scale the processing to the desired production rate because the chambers can be independently sized, i.e., not all chambers have to run at the same rate. For example, a single Mo chamber may be able to process web fast enough for four CIGS chambers, two CdS chambers and two ITO chambers. Similarly, additional chambers can be added more easily.

Chamber 24 is preferably maintained at a pressure of about $5 \times 10^{-5}$-Torr. Tension within the straight part of the transported moving strip (between rolls 60, 68) is held typically to within a range of about 0.5- to about 20-kg, and most preferably to within a range of about 3- to about 4-kgs. Linear transport speed lies preferably within the range of about 15-cm-per-minute to about 2-meters-per-minute, and most preferably about 30-cm-per-minute.

As strip material travels in chamber 24, from left-to-right as indicated by arrow 16, the developing CIGS layer increases generally quite linearly in thickness, from zero at the entrance end of deposition zone R, to (preferably) within the range of about 1- to about 3-micrometers, and most preferably to about 1.7 to 2.0-micrometers, at the downstream, exit end of this zone.

Zone R (the fog-containing zone) is illustrated in FIG. 10 as a freestanding rectangular block. Zone R has a length Z herein (FIGS. 6, 7, 9 and 10) of about 10- to about 250-cm, and most preferably about 80-cm, a width W (FIGS. 6, 7, 9 and 10) of about 90-cm, and a height H (FIGS. 6, 7 and 10) of about 25-cm. All Zone R dimensions are matters of choice and are somewhat a function of the substrate strip width and the effusion source size, and as mentioned before effusion source design and construction techniques outlined in this patent can be universally applied to very small strip widths and effusion source sizes, (i.e., 2.5-cm wide substrate strip and 5-cm wide sources) to very large reaction zones and substrate strip widths (1.5-m wide substrate strip and 2-m wide effusion sources). The fog in zone R is effective, as strip material passes through the zone, to create an extremely uniform-thickness, controlled-content, multi-element CIGS layer, such as previously mentioned layer 38.

Referring to FIG. 6, circles 76, 78, 79, 81 represent end views of plural, laterally spaced, generally parallel elongate sparger tubes (or fingers) that form part of a comb-like, single manifold (see also FIG. 9) that supplies, to the deposition environment within chamber 24, a relatively evenly volumetrically dispersed selenium vapor. Each sparger tube has a length of about 30-inches and a diameter of 0.25-in, and adjacent pairs of these tubes are characterized by a tube-to-tube spacing of about 8.9-cm. Length and spacing of the sparger tubes are, similar to the effusion sources, material of choice based on the substrate strip width and the effusion source size. Again principals outlined in this disclosure are applicable regardless of scale. Each tube, as illustrated herein, has three linearly spaced and distributed outlet orifices or vapor-ejection nozzles that are spaced from one another by about 15-cm. The diameter of each such sparger-tube orifice is about 0.1-cm. The "collection" of sparger-tube orifices (from a plan point of view) is substantially centered on Z×W footprint of zone R, and these orifice's discharge (upper) ends lie generally in a common plane which substantially parallels the strip-material transport plane at a distance of about 17.8-cm.

Figure 15:
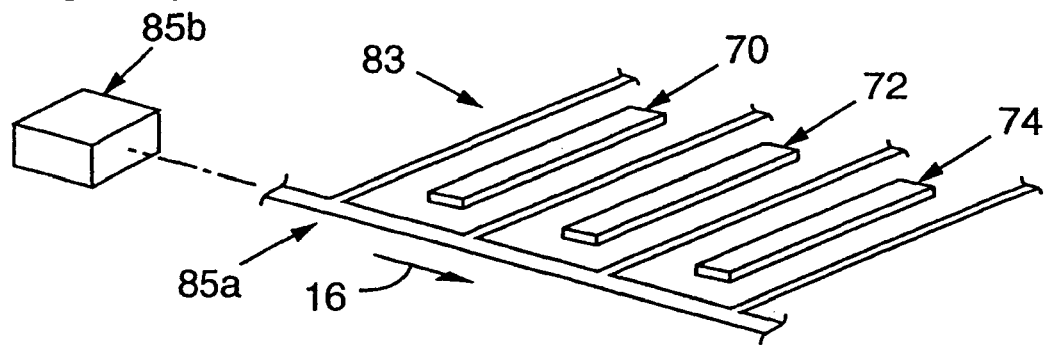
FIG. 15 schematically illustrates the basic component elements (including the selenium delivery elements) of a nozzle-based vapor-delivery apparatus according to the disclosed system, with this apparatus being shown isolated and removed from the chamber of FIG. 6.
Figure 16:
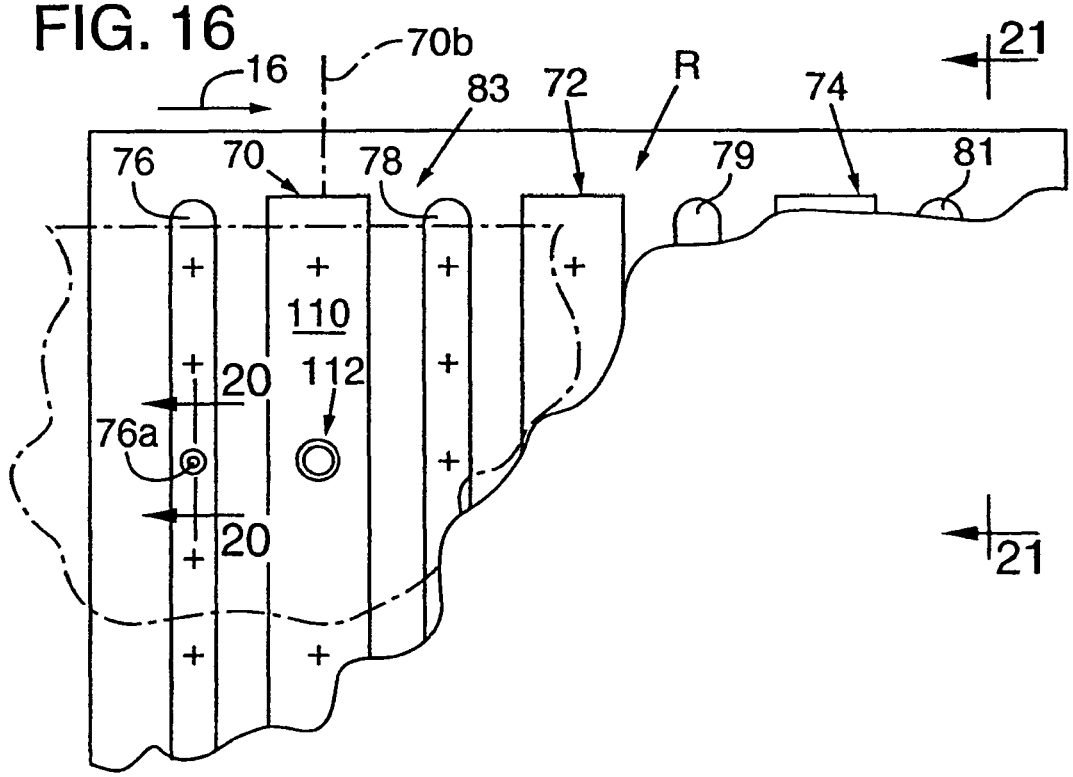
FIG. 16 is a fragmentary plan viewed of an upper left portion of the chamber of FIG. 9.
Figure 20:
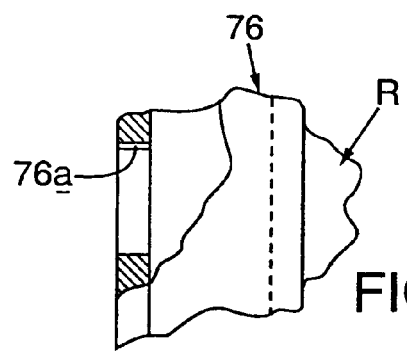
FIG. 20 is an enlarged, fragmentary cross-section taken generally along the line 20-20 in FIG. 16, showing an outlet port or nozzle in a sparger tube, or finger, which forms part of a comb-like manifold structure that functions to deliver selenium vapor in the disclosed embodiment.
Figure 21:
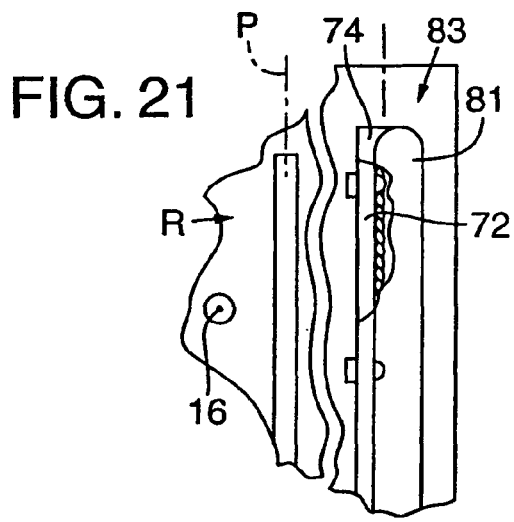
FIG. 21 is a fragmentary cross section taken generally along the line 21-21 in FIG. 16.
Figure 22:
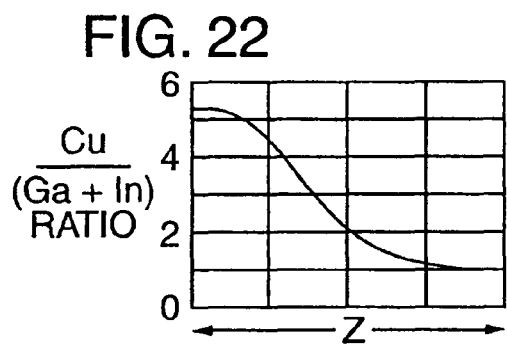
FIG. 22 is a graph picturing, generally, the ratio of copper to gallium-plus-indium at different locations along the length of deposition zone R. The left side of FIG. 22 relates to the entry end of zone R.
Figure 23:
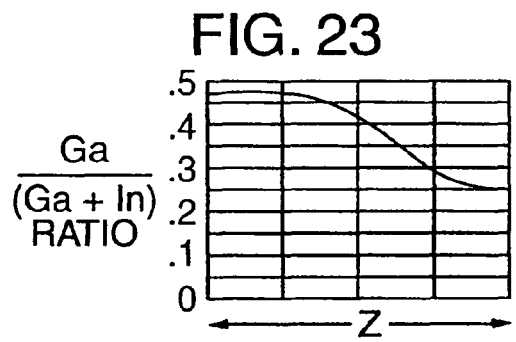
FIG. 23 is a graph illustrating, generally, the ratio of gallium to gallium-plus-indium at different points along the length of zone R, with this graph picturing, at its left-hand side, conditions at the entry end of zone R.

Four such sparger tubes are employed in the chamber structure now being described, with each sparger tube being equipped three vapor-ejection nozzles, such as representative nozzle 76a in sparger tube 76 (see particularly FIGS. 9, 16 and 20). Nozzle 76a has a diameter herein of about 0.100-cm (the nozzle's vertical dimension in FIG. 20), and an axial length of about 0.71-cm (its horizontal dimension in FIG. 20). Significantly, the delivered selenium vapor, which resides essentially at the saturation point within chamber 24, is derived from a single pool, site, or reservoir 85*b* (shown in FIGS. 9 and 15) of molten selenium.

These tubes are preferably made of stainless steel, but can be constructed of any material that is stable at high temperature, in vacuum in the presence of selenium and metal vapors. The tubes are located generally as shown in positions effectively bracketing opposite (left and right) sides in FIGS. 6 and 9 of each of blocks 70, 72, 74. This special selenium-vapor distribution system is preferable to prior art systems, which typically employ a plurality of spaced molten pools of selenium. Heat which functions to trigger and to sustain appropriate downstream vapor-distribution operation of this selenium-delivery system is derived from the close proximities of the sparger tubes and the heated crucibles in structures 70, 72, 74. In other words, radiant heat from these crucibles plays an important role in the delivery of selenium.

It should be noted that crucibles of structures 70, 72, 74, sparger tubes 76, 78, 79, 81, and the respective nozzles associated with these structures, are collectively substantially centered on the footprint of zone R (its W and Z dimensions). Preferably, the width W of zone R is somewhat greater than the width of the traveling strip material, and laterally, the width dimension of the strip material is substantially centered on width W. Consequently, the lateral boundaries, or edges, of the strip material are completely within zone R, and as strip material passes through the zone, it is treated to a generally bilaterally symmetrical engagement with the vapor components being deposited. The bilateral symmetry just mentioned is such symmetry viewed relative to the long axis 24*a* of chamber 24. See FIG. 9.

In general terms, and as is pictured schematically by the three downwardly-curving dashed lines in FIG. 6 that represent billowing plumes (such as previously mentioned plumes 70*a*, 72*a*) of copper, gallium and indium, created within chamber 24, generally in the previously mentioned deposition region, or zone, R, is a special co-evaporation fog (mentioned earlier) which is formed from these several effusion plumes (copper, gallium and indium), and from the selenium vapor (the sparger tubes) mentioned above.

At substantially each longitudinal point or transverse slice along zone R, and as a result of the nozzle spacing determined earlier, the fog therein is effectively uniform across the width of the zone, i.e., along the direction transverse to the direction of strip-material travel. As a result, each point along every line extending across the width of the strip material (perpendicular to the direction of material travel) advantageously is subject to approximately the same material-specific flux from each material-specific boat at any particular instant.

Figure 35:
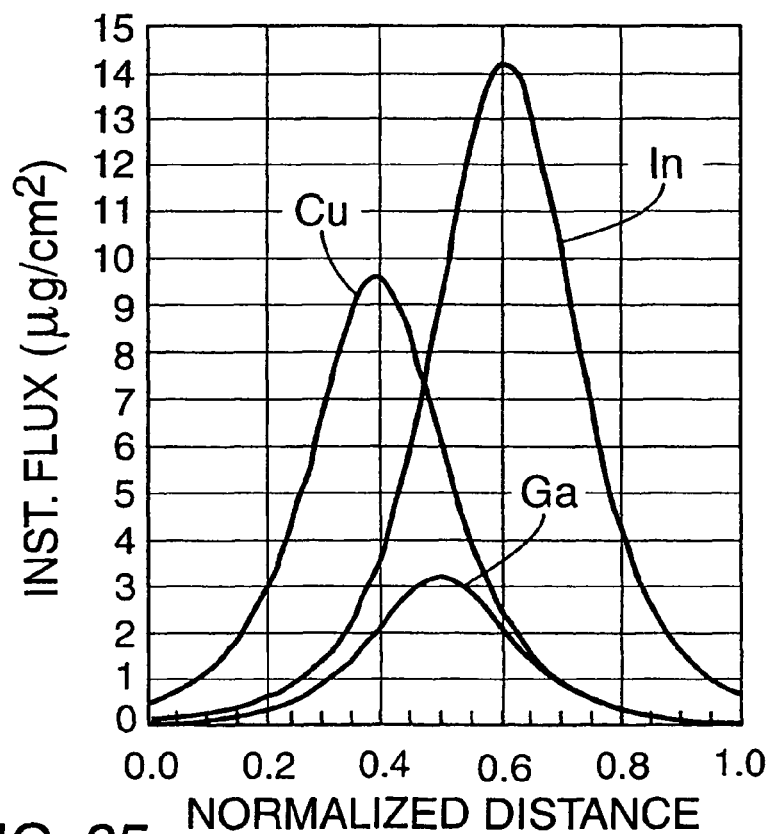
FIG. 35 illustrates the instantaneous flux of copper gallium and indium as a strip passes through the deposition zone.

As the strip of Mo-coated substrate material travels in chamber 24 through the vapor deposition zone, each point on that material first passes directly over the copper source, thereafter over the gallium source, thereafter over the indium source, and throughout, over the selenium sources (the sparger tubes). With this arrangement, and recognizing that selenium vapor is distributed rather evenly throughout zone R, each point on the moving strip material first encounters a continuum co-evaporation environment which is substantially copper-rich, but which also contains lesser amounts of gallium and indium vapor. As a particular point on the strip travels through the fog, it next encounters a region, in the comingled, aggregate fog, which is substantially gallium-rich, but which also contains copper and indium vapor. Each point on the strip thereafter encounters a region in zone R that is substantially indium-rich, but which contains lesser concentrations of gallium vapor and copper vapor. Significantly and preferably, this transition from copper-rich, through gallium-rich and finally to an indium-rich vapor occurs in a setting wherein the specific, individual fluxes from molten copper, gallium, indium, and selenium sources are maintained substantially constant as a function of time. In the process of the invention now being described, it is the travel of the strip material through zone R that causes each point on that material to experience the aforementioned, longitudinally-spatially-changing vapor (fog) sub-environments. By maintaining the effusion rate from each boat substantially constant over time, and by moving the strip material at a substantially constant rate of speed, the contribution to the CIGS layer attributable to each of the molten metal sources may be precisely controlled along the length of the deposition zone. Using similar equations applied to determine the optimum nozzle spacing within a source, as the strip transitions through the zone, at any instantaneous point in time, the instantaneous flux at the strip and the cumulative composition of the CIGS film deposited on the strip can be determined. The strip will have a incident flux of each of the elements that is a strong function of the position of the strip in the zone. The incident flux at any instantaneous time can be plotted as the strip transfers through the zone. FIG. 35 shows the instantaneous flux as a function of position as the web transfers through Zone R for the copper, gallium and indium sources. This figure shows that the strip first encounters a large copper flux, but also a flux from the gallium and indium. As the strip continues, the gallium, and then the indium fluxes become dominant.

Figure 36:
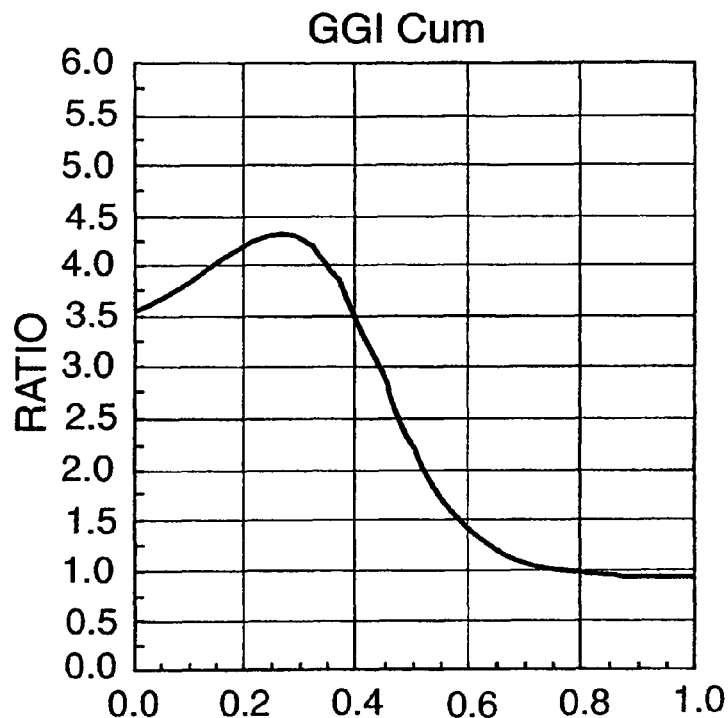
FIG. 36 illustrates the instantaneous ratio of Cu/(In+Ga) as the strip passes through the deposition zone.
Figure 37:
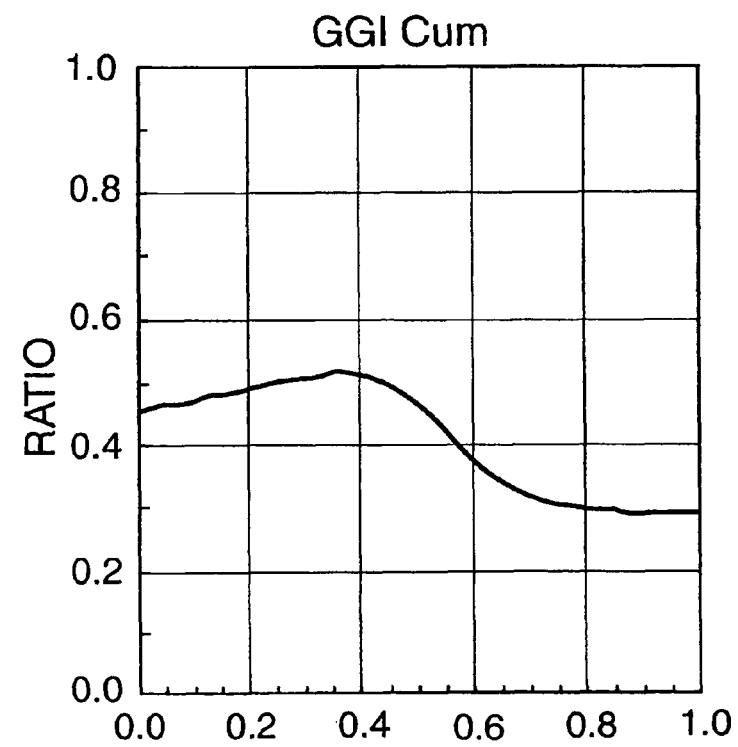
FIG. 37 illustrates the instantaneous ratio of Ga/(In+Ga) as the strip passes through the deposition zone.

In a similar fashion, the cumulative composition of copper, gallium, and indium can be calculated for the strip as it transitions through the zone, as graphically shown in FIGS. 36 and 37. As was mentioned above, the respective vapor effusion rates of copper, gallium and indium from the crucibles/boats in structures 70, 72, 74, respectively, are controlled in such a fashion that the entrance end of zone R is copper-rich, the middle region of this zone is gallium-rich, and the exit end of the zone is indium-rich. In particular, we have found that, by establishing appropriate effusion rates for copper, gallium and indium: (a), within the entrance end of zone R, the ratio (Cu)/(Ga+In) is generally about 3.4, and the ratio (Ga)/(Ga+In) is generally about 0.46; (b), within the middle region of zone Z, the ratio (Cu)/(Ga+In) is generally about 1.9, and the ratio (Ga)/(Ga+In) is generally about 0.43; and (c), within the exit end of zone Z, the ratio (Cu)/(Ga+In) is generally between 0.8 and 0.92, most preferably, about 0.88, and the ratio (Ga)/(Ga+In) is between generally between 0.25 and 0.3, most preferably 0.275.

The CIGS layer created with either chamber organization (FIGS. 6 and 12) has an internal make-up or composition of approximately 23.5 atomic percent copper, 19.5 atomic percent indium, 7 atomic percent gallium, and 50 atomic percent selenium. The key difference is the CIGS formed in the chamber of FIG. 12 better tolerates mechanical stresses imparted on the film as a consequence of fabricating the unique flexible photovoltaic device disclosed herein.

As described above, the copper, gallium, and indium effusion sources each include a shielded, insulatively enclosed, heated subchamber or crucible wherein source material is heated to a molten condition, and from which subchamber vapor-phase metal readily exits through the nozzle openings to become part of the deposition fog. As a result, the vessels may be placed fairly close to one another and fairly close to the path of the traveling strip material. This allows precise control over the distribution geometry of the respective plumes emanating from each respective effusion source and, therefore, effective control over the aggregate fog resulting from the comingling of the plumes from all three effusion sources. In addition, by so establishing thermal insulation and isolation, the effusion sources may be placed close enough to the path of strip travel to maximize (as suggested above) the effectiveness of material deposition without causing overheating of the reception strip material.

During co-evaporation in chamber 24, and in accordance with practice of this invention, special attention is directed toward the production and maintenance of the effective deposition temperature, also called herein the local processing temperature, of the strip-material surface upon which deposition occurs. To assure proper interlayer integrity and adhesion between Mo and CIGS and to assure proper formation of an ultimately well-functioning, clearly defined and established polycrystalline CIGS layer, it is preferable that the local spot or region which is currently receiving deposition treatment be held at between 300 and 650° C., preferably below 4500 for the polyamide substrate and at 550° for substrates capable of higher temperatures such as stainless steel, titanium, and glass.

From all of the above discussion relating to nozzle placement, population and sizing, it is apparent that there is substantial room to vary any one of more of these parameters to achieve a deposition fog environment of a specific desired character. Thus, while we have found preferable for the specific process described in this document to have three nozzles present in each of crucibles 70, 72, 74, and with each nozzle in each crucible being substantially the same in construction (sizing, etc.), these particular choices could be changed. For example, one could choose to use more or less than three nozzles per crucible. One, also, could choose to use different numbers of nozzles with respect to different crucibles. The nozzles themselves, (either with regard to an inter-crucible way of thinking about things, or with regard to an intra-crucible way of thinking about things), could have different respective axial lengths and diameters.

For the purpose of describing one preferred way of creating a CIGS layer herein, chamber 24 is illustrated and specifically discussed as including (in addition to the structure provided for delivering selenium vapor) just the three vapor-delivery blocks 70, 72, 74. However, a very useful alternative approach employable in practicing this invention employs a multitude of such blocks distributed within chamber 24. Use of this alternative allows unique control of the CIGS through thickness composition that can alter, positively or negatively, the performance of the resultant CIGS thin film photovoltaic material.

Figure 12:
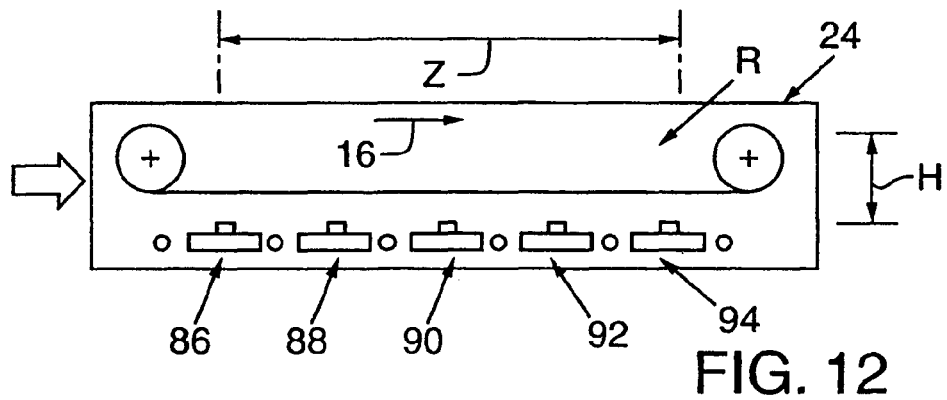
FIG. 12 presents a schematic side elevation view of an alternative chamber wherein another format of CIGS or CIS roll-to-roll strip processing occurs according to another embodiment of the present invention, with this other format involving movement of strip expanses past five vapor-creating stations.

Several source orders have been investigated to achieve the optimum composition. An alternative construction for chamber 24 is illustrated in FIGS. 12-14. The primary distinction, relative to the first-described chamber-24 construction, is the use of five rather than three elongate, heated, vapor-delivery effusion sources 86, 88, 90, 92 and 94 (generally like previously discussed effusion sources 70, 72, 74). It should be noted that a space with no vapor source is provided between second and third effusion sources. The nozzles (three each) in the central vessel 90 delivers copper vapor; those in effusion sources 86 and 92 delivery gallium vapor; and those in vessels 88 and 94 deliver indium vapor. An additional modification includes a final gallium deposition employed after the final indium in FIGS. 12-14, more will be said about this alternative possibility later—a special alternative which can be thought of as possessing "longitudinal vapor (material)-delivery symmetry".

Figure 38:
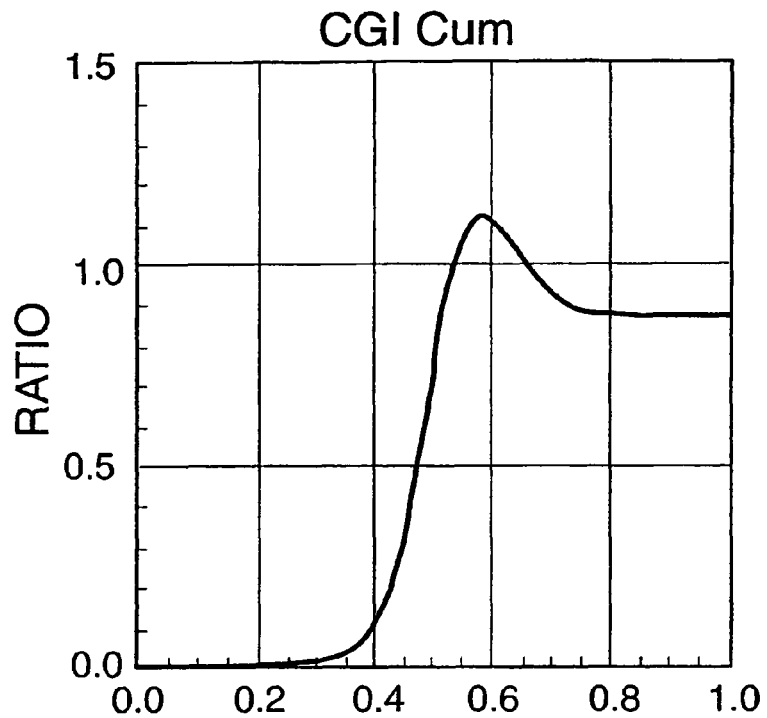
FIG. 38 illustrates the cumulative ratio of Cu/(In+Ga) as the strip passes through the deposition zone.
Figure 39:
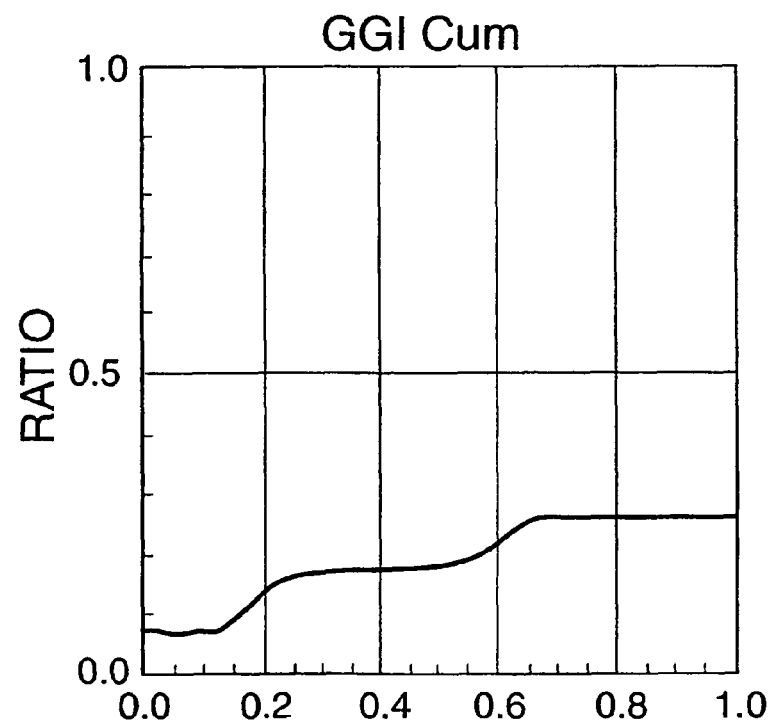
FIG. 39 illustrates the cumulative ratio of Ga/(In+Ga) as the strip passes through the deposition zone.
Figure 40:
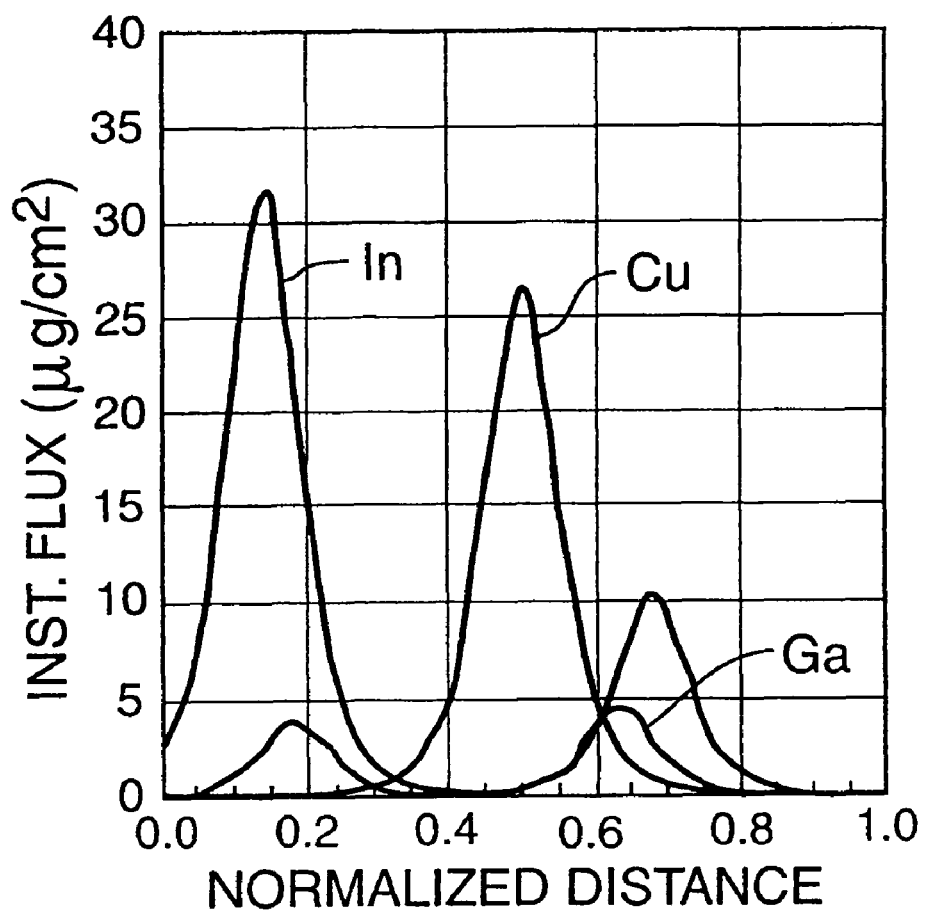
FIG. 40 illustrates the instantaneous flux of constituents as the strip passes through the deposition zone.

Thus, each point on the surface of a strip passing through this version of chamber 24 encounters, in sequence: a gallium/indium-rich region, a copper-rich region, and finally, another indium/gallium-rich region. This "encounter" experience can be thought of as involving a kind of longitudinal material-deposition symmetry within zone R. Similar to the three source example, instantaneous flux of a point on the strip can be plotted as a function of position in Zone R, as graphically shown in FIGS. 38 and 39. As was mentioned above, the respective vapor effusion rates of the five effusion sources 86, 88, 90, 92 and 94, respectively, are controlled in such a fashion that the entrance end of zone R is indium-gallium, the middle region of this zone is copper-rich, and the exit end of the zone is gallium-indium-rich, as graphically illustrated in FIG. 40. In particular, we have found that, by establishing appropriate effusion rates for all sources: (a), within the entrance end of zone R, the ratio (Cu)/(Ga+In) is generally about 0.0, and the ratio (Ga)/(Ga+In) is generally about 0.35; (b), within the middle region of zone Z above the copper source, the ratio (Cu)/(Ga+In) is generally about 1.1, and the ratio (Ga)/(Ga+In) is generally about 0.2; and (c), within the exit end of zone Z, the ratio (Cu)/(Ga+In) is generally between 0.8 and 0.92, most preferably, about 0.88, and the ratio (Ga)/(Ga+In) is between generally between 0.25 and 0.3, most preferably 0.275.

In accordance with a preferred embodiment of the system of the present invention, the molten temperature of gallium within crucible 86 is suitably maintained in the range of about 1000° C. to about 1350° C., and most preferably at a temperature of about 1120° C. (+/− about 1° C.). The temperature of the molten indium within crucible 84 is suitably maintained within the range of about 950° C. to about 1300° C., and most preferably at about 1130° C. (+/− about 1° C.). The temperature of the molten copper within crucible 86 is suitably maintained within the range of about 1350° C. to about 1700° C., and most preferably at about 1496° C. (+/− about 1° C.). The temperature of the molten gallium within crucible 88 is suitably maintained within the range of about 1000° C. to about 1350° C., and most preferably at about 1130° C. (+/− about 1° C.). Finally, the temperature of the molten indium within crucible 94 is most appropriately (according to what we have learned in our practice of use of this invention) maintained in the range of about 950° C. to about 1300° C., and most preferably at about 1055° C. (+/− about 1° C.). The temperature of molten selenium in reservoir 85b is preferably maintained in the range of about 275° C. to about 500° C., and most preferably to about 415° C. (+/− about 0° C.). As stated before, although these temperatures are in the preferred range for the disclosed sources with 0.95-cm orifices, the rate restricting nozzle principals outlined herein indicated that as the orifice increases, the temperature would decrease to achieve a constant rate, or alternatively, as the orifice decreases, the temperature would increase to achieve a constant rate.

This sequential exposure to the initial copper-poor material, followed by copper-rich material as the strip passes over the central copper source, and then transition back to a slightly copper-poor CIGS composition, results in a CIGS film with a good combination of adhesion to the underlying Mo layer and high conversion efficiency. Variations of the sequence between the gallium and indium sources on both sides of the centrally located copper have also been employed successfully.

Essentially all other environmental and operational conditions and parameters within chamber 24, as pictured in FIGS. 12-14, as well as all temperatures, spacing and other dimensions, match substantially those counterpart characteristics present in the first-discussed version of chamber 24. The chief apparent difference resides in the distributed order and pattern in and by which the positional-content-variable constituents of the deposition fog are encountered by regions on the traveling strip material. CIGS/CIS deposition by way of an arrangement such as that pictured in FIGS. 12-14, offers somewhat different opportunities for deposition delivery control than does the arrangement shown in FIGS. 6-10.

Differentiating reasons for choosing to employ, for example, one or the other of these two illustrated arrangements are outlined below. For the three source arrangement, principal advantages include simplified control of three sources, ensuring the copper rich stage which is an important factor in achieving high efficiency, however, controlling adhesion of the CIGS deposited by the three source technique to substrates with a large coefficient of thermal expansion mismatch with the absorber is difficult. Additionally, the three source arrangement is more likely to lead to through thickness composition variations that may limit the photovoltaic device performance. Principal advantages of the five source arrangement are improved adhesion, even with substrates with a large CTE mismatch to CIGS, and greater ability to tailor the through thickness composition to enhance the photovoltaic device performance. The key challenge with the five source arrangement is controlling the relative fluxes of indium and gallium on either side of the centrally located copper source. We further recognize that other considerations might well dictate a preference for selecting and implementing an altogether different distributed vapor-plume layout, and these other kinds of approach can certainly be determined easily by those skilled in the art in view of the present disclosure.

Typically, the exposed surface of a deposited CIS or CIGS layer will have a quite irregular, three-dimensional surface topography, with such topography being characterized by many randomly distributed peaks and valleys. The character of this surface is the primary determinant of the desirability of utilizing an i-ZnO layer immediately underneath the final, conductive ZnO:Al layer. It is important that the CdS layer completely separates the CIS layer from the top contact layer. Therefore, where the CdS layer alone provides adequate separation, no supplemental insulating layer is necessary. However, where the CdS layer does not sufficiently cover the CIS layer, the i-ZnO layer can provide such separation. As was mentioned earlier, the present invention avoids the necessity of using a CdS wet-dipping technique—favoring instead, and preferably, the application of the CdS layer by way of RF-sputtering. However, the resulting CdS layer is thinner and less certain to completely isolate the two layers it lies between. This issue is more significant where a typical, prior art, wet-dipping technique for applying a layer of CdS is not used. With RF-sputtering preference, it is generally desirable, at least in certain instances, to include such an i-ZnO intermediary layer. Determination, of course, about whether to include, or not to include, this layer is dependent on the particular application and is a matter of design choice.

The chamber-representing blocks 26, 28 and 30 illustrated in FIG. 11 can be viewed, as has been mentioned, as illustrating the steps, and the equipment employed therefor, involved in creating (a) the mentioned CdS layer, (b) the mentioned optional i-ZnO layer, and (c) the final conductive-oxide ZnO:Al overlayer.

The short open arrow at the left side of FIG. 11 represents input parameters and equipment related to the deposition environment which exists within the processing chamber drawn in FIG. 11. The particulars of such input parameters are specifically related to the specific task to be performed in a chamber like the one drawn in FIG. 11—i.e., CdS deposition, i-ZnO deposition, and ZnO:Al deposition.

Viewing FIG. 11 first of all as an illustration relating to CdS deposition, and with the chamber representation for this purpose being numbered 26, appropriate equipment is provided in and for this chamber to implement a roll-to-roll procedure for the formation, on the previously formed CIGS layer, of a CdS layer. In the practice of the present invention, the CdS layer is created efficiently, inexpensively and safely in chamber 26 by way of RF-sputtering. Preferably, such sputtering is used to create a CdS layer with a thickness generally in the range of about 300- to about 2500-Angstroms. Most preferably, in a case where an intermediary i-ZnO layer is employed, the CdS layer has a thickness of about 600-Angstroms. In a situation where such an intermediary layer is not used, the CdS layer may have a thickness of about 1200-Angstroms. This sputtering approach to the building of the CdS layer is effective at creating substantially full-surface coverage of the underlying CIGS layer—i.e., dealing with the many typical peaks and valleys mentioned earlier which exist on the exposed surface of the CIGS layer. It should be noted that low frequency alternating current, or AC, sputtering could also be employed to deposit the CdS layer.

RF-sputtering of the CdS layer employs an appropriate CdS target, and this sputtering takes place preferably at an RF frequency of 13.5-MHz. The power level employed for sputtering is chosen to coordinate layer-formation activity with a selected strip linear transport speed to achieve the desired CdS layer thickness. An appropriate transport speed lies in the range of about 1.0-cm-per-minute to about 2-meters-per-minute, and a transport speed of about 30-cm-per-minute is particularly suitable. Within this strip transport speed, appropriate RF power ranges between 100 and 1200 watts, most appropriately at 300 watts.

Following CdS-layer formation, the take-up roll 60 from chamber 26 which now contains a layer structure including CdS is transferred to another isolated processing chamber 28 of FIG. 11, wherein the optional intermediary i-ZnO layer is created. This layer is established utilizing a DC sputtering technique to achieve a final layer thickness preferably in the range of about 100- to about 1000-Angstroms, and most preferably about 400-Angstroms.

Referring now specifically to the making of this i-ZnO layer, oxide targets employed for this purpose are typically sintered during manufacture, and during such sintering, these targets often lose some of their elemental oxygen, thus rendering the target substoichiometric. This loss of oxygen and concomitant substoichiometric condition renders the target slightly conductive, as opposed to a stoichiometric zinc oxide target which would be nonconductive.

Recognizing the fact that, where an i-ZnO sublayer is to be created it should end up as a very poorly conductive layer, we nevertheless preferably choose to employ substoichiometric zinc-oxide as a "starter" material because such material especially facilitates the use of the preferred DC sputtering technique, as opposed to an RF sputtering technique. In this context, the use of such a substoichiometric (e.g., oxygen-deficient) zinc-oxide target tends to suppress and even eliminate the usual positive charge buildup which tends to occur on the surface of more conventional, stoichiometric targets during DC sputtering. In the present invention, the substoichiometric starter target is compensated for by, for example, providing a supply of oxygen into the chamber-28 sputtering environment. In particular, an appropriate external supply tank containing compressed oxygen can be used to furnish and support a controlled bleed of oxygen into chamber 28. By providing oxygen into such a sputtering environment, the substoichiometric zinc-oxide target effectively applies an appropriate conductivity intrinsic-zinc-oxide layer to the traveling strip material, notwithstanding the target's nominal, oxygen-deficient, substoichiometric starter character. It should be noted that RF or low frequency alternating current, or AC, sputtering could also be employed to deposit the i-ZnO layer using stoichiometric ZnO targets.

The last PV-operative layer to be created according to the practice of the present invention is the overlying conductive-oxide layer, herein ZnO:Al. This is done in chamber 30 (the third point-of-view for FIG. 11) under appropriate internal environmental conditions which are effective to create a final ZnO:Al layer with a thickness in the range of about 2000- to about 15,000-Angstroms, and most preferably within the somewhat narrower range of about 10,000- to about 12,000 Angstroms.

The next steps comprise the methodology for monolithically integrating individual PV cells on the elongated strip from above into a PV module.

Following completion of the i-ZnO deposition or alternatively, CdS deposition where the optional i-ZnO layer is not utilized, the roll is transferred to the laser isolation equipment. The laser is utilized to selectively remove material (e.g. CIGS or CIS, CdS, intrinsic ZnO, and Mo) through the Mo layer to the PI, thereby electrically isolating adjacent cells. In the present embodiment, the beam of laser light moves while the substrate is stationary, but other options can presumably be as effective. For this step the laser presently moves relative to the substrate at 12-inches per second.

Using the same equipment, a dielectric layer, which utilizes a UV curable insulating polymer, is concurrently applied by ink-jet printing methods over the laser-scribed area, and within seconds is cured by a directed, intense UV source. The UV curable material was chosen such that it can be cured rapidly after application and such that it can be applied over a width less than 400 micrometers and preferably less than 125 micrometers but greater than 60 micrometers. The orifice diameter of the ink-jet applicator is between 100 micrometers and 300 micrometers with a preferred diameter of approximately 100 to 150 micrometers. The thickness of the resulting layer is approximately 60 micrometers, however this specific dimension is not considered critical. The more significant properties for this UV curable insulating material are its adhesion to the CdS, the i-ZnO, if utilized, the CIGS or CIS, and the Mo, its viscosity, its slump, its rate of cure, and its surface characteristics since it must allow for good over-layer adhesion by the conductive oxide. Various combinations of these critical parameters will result in satisfactory performance.

Again using the same laser equipment, a second laser cut is utilized for the selective removal of material (e.g. CIGS or CIS, CdS, intrinsic ZnO) to provide access to the Mo layer. This access is necessary to allow the next layer, the conductive-oxide overlayer, to bridge from the top of one cell to the back electrode (Mo) of the adjacent cell. For this step the laser presently moves relative to the substrate at 30-cm per second. The conductive-oxide overlayer is deposited as described earlier. A third laser cut is utilized for a selective removal of conductive-oxide overlayer material, thereby isolating individual cells and completing the monolithic interconnection of previously-individual adjacent cells.

Assuming that proper thin-film "patterning" has been performed to result in monolithically interconnected PV modules, then protective overcoatings, if any such coatings are desired, are then produced in a conventional manner, and electrical contact structures, which are required to tap the electrical output power that can be generated by each such module, are appropriately established—again, utilizing conventional and well-known techniques for such activity.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

We claim:

1. A vapor deposition effusion source, comprising an elongate vessel having a base, and side walls joined to the base, the side walls having insulation for limiting heat loss, the vessel having a lid including a main plane portion generally parallel to the base and plural nozzles, each nozzle having an inner wall defining a passage projecting upward in a first direction perpendicular to the main plane portion of the lid, wherein the lid has a heating element defining a path around the nozzle passages, the heating element having a cross-section that is perpendicular to the path, the cross-section of the heating element having a length dimension and a width dimension, the length dimension of the cross-section being oriented parallel to the first direction of the passage and perpendicular to the main plane portion of the lid.

2. The vapor deposition effusion source of claim 1, wherein the heating element in the lid is configured to supply substantially all of the heat required to evaporate material from within the walls of the vessel through the nozzles in the lid.

3. The vapor deposition effusion source of claim 1, wherein the lid is the only part of the vessel that has a heating element.

4. The vapor deposition effusion vessel of claim 1, wherein the heating element is U-shaped following a path running adjacent opposing sides of each nozzle.

5. The vapor deposition effusion vessel of claim 1, wherein the lid has a U-shaped slot passing by opposing sides of each nozzle, the heating element being positioned in the slot.

6. The vapor deposition effusion vessel of claim 1, wherein the heating element is controllable to maintain the lid and nozzles at temperatures higher then the temperature of molten material contained within the vessel.

7. The vapor deposition effusion vessel of claim 1, wherein the heating element in the lid encircles the plural nozzles, and has electrical contacts connected to an electrical source on the same circumferential side of the vessel.

8. The vapor deposition effusion vessel of claim 1, wherein the nozzles are integrally formed into the lid.

9. The vapor deposition effusion vessel of claim 1, wherein all of the nozzles in the lid are located along the same elongate axis of the vessel.

10. The vapor deposition effusion source of claim 1, wherein the heating element is a separate structure from the nozzles.

11. The vapor deposition effusion source of claim 1, wherein the passage of each nozzle has a height culminating in a rim, the length dimension of the cross-section of the heating element being more than half of the height of the passage and not extending above the rim of each nozzle.

* * * * *